(12) United States Patent
Corso

(10) Patent No.: US 6,750,076 B2
(45) Date of Patent: Jun. 15, 2004

(54) FABRICATION OF A MICROCHIP-BASED ELECTROSPRAY DEVICE

(75) Inventor: Thomas N. Corso, Lansing, NY (US)

(73) Assignee: Advion Biosciences, Inc., Ithaca, NY (US)

( * ) Notice: Subject to any disclaimer, the term of this patent is extended or adjusted under 35 U.S.C. 154(b) by 77 days.

(21) Appl. No.: 10/246,011

(22) Filed: Sep. 17, 2002

(65) Prior Publication Data
US 2003/0073260 A1 Apr. 17, 2003

Related U.S. Application Data
(60) Provisional application No. 60/322,814, filed on Sep. 17, 2001.

(51) Int. Cl.[7] ................................................. H01L 21/00
(52) U.S. Cl. .................. 438/48; 438/689; 438/719; 438/753
(58) Field of Search ...................... 438/48–53, 688–753

(56) References Cited

U.S. PATENT DOCUMENTS

| | | | |
|---|---|---|---|
| 5,501,893 A | 3/1996 | Laermer et al. | |
| 5,992,769 A | 11/1999 | Wise et al. | |
| 6,093,330 A | 7/2000 | Chong et al. | |
| 6,103,399 A | 8/2000 | Smela et al. | |
| 6,402,972 B1 * | 6/2002 | Weber et al. | ................. 216/27 |

OTHER PUBLICATIONS

Harrison et al., "Micromachining a Miniaturized Capillary Electrophoresis–Based Chemical Analysis System on a Chip," *Science* 261:895–897 (1993).
Jacobson et al., "High–Speed Separations on a Microchip," *Anal. Chem.* 66:1114–1118 (1994).
Jacobson et al., "Open Channel Electrochromatography on a Microchip," *Anal. Chem.* 66:2369–2373 (1994).
Kutter et al., "Integrated Microchip Device with Electrokinetically Controlled Solvent Mixing for Isocratic and Gradient Elution in Micellar Electrokinetic Chromatography," *Anal. Chem.* 69:5165–5171 (1997).
He et al., "Fabrication of Nanocolumns for Liquid Chromatography," *Anal. Chem.* 70:3790–3797 (1998).
Dole et al., "Molecular Beams of Macroions," *J. Chem. Phys.* 49:2240–2249 (1968).
Yamashita et al., "Electrospray Ion Source. Another Variation on the Free–Jet Theme," *J. Phys. Chem.* 88(20):4451–4459 (1984).
David P.H. Smith, "The Electrohydrodynamic Atomization of Liquids," *IEEE Transactions on Industry Applications* IA–22(3):527–535 (1986).
*Electrospray Ionization Mass Spectrometry: Fundamentals, Instrumentation, and Applications*, ed. R.B. Cole, ISBN 0–471–14564–5; New York, New York:John Wiley & Sons, Inc., pp. 3–63 (1997).

(List continued on next page.)

* cited by examiner

*Primary Examiner*—H. Jey Tsai
(74) *Attorney, Agent, or Firm*—Nixon Peabody LLP

(57) ABSTRACT

A method for fabricating a nozzle of microchip-based electrospray device is disclosed. The method includes using a primary mask to accurately define the nozzle feature including the annulus and the through hole of the electrospray device. A secondary masking step is conducted to pattern the through channel (typical the photoresist would serve as the secondary mask), followed by the defining and etching of the primary mask containing the full nozzle feature. The secondary mask serves to selectively mask given areas of the primary mask for subsequent etching. The through hole feature of the secondary mask aligns over the already patterned primary mask through channel, except that the secondary mask contains a slightly larger through channel diameter. This serves to mask off the annulus, but allowing the silicon through channel to be exposed for etching.

2 Claims, 23 Drawing Sheets

OTHER PUBLICATIONS

Wilm et al., "Electrospray and Taylor–Cone Theory, Dole's Beam of Macromolecules at Last?" *Intl. J. Mass Spectrom, Ion Processes* 136:167–180 1994.

Gale et al., "Small Volume and Low Flow–rate Electrospray Ionization Mass Spectrometry of Aqueous Samples," *Rapid Commun. Mass Spectrom.* 7:1017–1021 (1993).

Ramsey et al., "Generating Electrospray from Microchip Devices Using Electroosmotic Pumping," *Anal. Chem.* 69:1174–1178 (1997).

Xue et al., "Multichannel Microchip Electrospray Mass Spectrometry," *Anal. Chem.* 69:426–430 (1997).

Desai et al., "A MEMS Electrospray Nozzel for Mass Spectroscopy," 1997 Int. Conference on Solid State Sensors and Actuators, Chicago, pp. 927–930 (Jun. 16–19, 1997).

Wang et al., "Polymer–Based Electrospray Chips for Mass Spectrometry," Twelfth IEEE International Conference on Micro Electro Mechanical Systems, Orlando, Florida, pp. 523–528 (1999).

Laermer et al., "Bosch Deep Silicon Etching: Improving Uniformity and Etch Rate for Advanced Mems Applications," Twelfth IEEE International Conference on Micro Electro Mechanical Systems, Orlando, Florida, pp. 211–216 (1999).

FABRICATION OF A MICROCHIP-BASED ELECTROSPRAY DEVICE

This application claims the benefit of U.S. Provisional Patent Application Serial No. 60/322,814, filed Sep. 17, 2001, which is herein incorporated by reference in its entirety.

FIELD OF THE INVENTION

The present invention relates generally to the fabrication of an integrated miniaturized fluidic system fabricated using Micro-ElectroMechanical System (MEMS) technology, particularly to the improved fabrication of a microsized electrospray nozzle.

BACKGROUND OF THE INVENTION

Microchip-based separation devices have been developed for rapid analysis of large numbers of samples. Compared to other conventional separation devices, these microchip-based separation devices have higher sample throughput, reduced sample and reagent consumption, and reduced chemical waste. The liquid flow rates for microchip-based separation devices range from approximately 1–300 nanoliters per minute for most applications. Examples of microchip-based separation devices include those for capillary electrophoresis ("CE"), capillary electrochromatography ("CEC") and high-performance liquid chromatography ("HPLC") include Harrison et al., *Science* 261:859–97 (1993); Jacobson et al., *Anal. Chem.* 66:1114–18 (1994), Jacobson et al., *Anal. Chem.* 66:2369–73 (1994), Kutter et al., *Anal. Chem.* 69:5165–71 (1997) and He et al., *Anal. Chem.* 70:3790–97 (1998). Such separation devices are capable of fast analyses and provide improved precision and reliability compared to other conventional analytical instruments.

The work of He et al., *Anal. Chem.* 70:3790–97 (1998) demonstrates some of the types of structures that can be fabricated in a glass substrate. This work shows that co-located monolithic support structures (or posts) can be etched reproducibly in a glass substrate using reactive ion etching (RIE) techniques. Currently, anisotropic RIE techniques for glass substrates are limited to etching features that are 20 $\mu$m or less in depth. This work shows rectangular 5 $\mu$m by 5 $\mu$m width by 10 $\mu$m in depth posts and stated that deeper structures were difficult to achieve. The posts are also separated by 1.5 $\mu$m. The posts supports the stationary phase just as with the particles in LC and CEC columns. An advantage to the posts over conventional LC and CEC is that the stationary phase support structures are monolithic with the substrate and therefore, immobile.

He et. al., also describes the importance of maintaining a constant cross-sectional area across the entire length of the separation channel. Large variations in the cross-sectional area can create pressure drops in pressure driven flow systems. In electrokinetically driven flow systems, large variations in the cross-sectional area along the length of a separation channel can create flow restrictions that result in bubble formation in the separation channel. Since the fluid flowing through the separation channel functions as the source and carrier of the mobile solvated ions, formation of a bubble in a separation channel will result in the disruption of the electroosmotic flow.

Electrospray ionization provides for the atmospheric pressure ionization of a liquid sample. The electrospray process creates highly-charged droplets that, under evaporation, create ions representative of the species contained in the solution. An ion-sampling orifice of a mass spectrometer may be used to sample these gas phase ions for mass analysis. When a positive voltage is applied to the tip of the capillary relative to an extracting electrode, such as one provided at the ion-sampling orifice of a mass spectrometer, the electric field causes positively-charged ions in the fluid to migrate to the surface of the fluid at the tip of the capillary. When a negative voltage is applied to the tip of the capillary relative to an extracting electrode, such as one provided at the ion-sampling orifice to the mass spectrometer, the electric field causes negatively-charged ions in the fluid to migrate to the surface of the fluid at the tip of the capillary.

When the repulsion force of the solvated ions exceeds the surface tension of the fluid being electrosprayed, a volume of the fluid is pulled into the shape of a cone, known as a Taylor cone, which extends from the tip of the capillary. A liquid jet extends from the tip of the Taylor cone and becomes unstable and generates charged-droplets. These small charged droplets are drawn toward the extracting electrode. The small droplets are highly-charged and solvent evaporation from the droplets results in the excess charge in the droplet residing on the analyte molecules in the electrosprayed fluid. The charged molecules or ions are drawn through the ion-sampling orifice of the mass spectrometer for mass analysis. This phenomenon has been described, for example, by Dole et al., *Chem. Phys.* 49:2240 (1968) and Yamashita et al., *J. Phys. Chem.* 88:4451 (1984). The potential voltage ("V") required to initiate an electrospray is dependent on the surface tension of the solution as described by, for example, Smith, *IEEE Trans. Ind. Appl.* 1986, IA-22:527–35 (1986). Typically, the electric field is on the order of approximately $10^6$ V/m. The physical size of the capillary and the fluid surface tension determines the density of electric field lines necessary to initiate electrospray.

When the repulsion force of the solvated ions is not sufficient to overcome the surface tension of the fluid exiting the tip of the capillary, large poorly charged droplets are formed. Fluid droplets are produced when the electrical potential difference applied between a conductive or partly conductive fluid exiting a capillary and an electrode is not sufficient to overcome the fluid surface tension to form a Taylor cone.

*Electrospray Ionization Mass Spectrometry: Fundamentals, Instrumentation, and Applications*, edited by R. B. Cole, ISBN 0-471-14564-5, John Wiley & Sons, Inc., New York summarizes much of the fundamental studies of electrospray. Several mathematical models have been generated to explain the principals governing electrospray. Equation 1 defines the electric field $E_c$ at the tip of a capillary of radius $r_c$ with an applied voltage $V_c$ at a distance d from a counter electrode held at ground potential:

$$E_c = \frac{2V_c}{r_c \ln(4d/r_c)} \qquad (1)$$

The electric field $E_{on}$ required for the formation of a Taylor cone and liquid jet of a fluid flowing to the tip of this capillary is approximated as:

$$E_{on} \approx \left(\frac{2\gamma \cos\theta}{\varepsilon_0 r_c}\right)^{1/2} \qquad (2)$$

where $\gamma$ is the surface tension of the fluid, $\theta$ is the half-angle of the Taylor cone and $\varepsilon_0$ is the permittivity of vacuum. Equation 3 is derived by combining equations 1 and 2 and approximates the onset voltage $V_{on}$ required to initiate an electrospray of a fluid from a capillary:

$$V_{on} \approx \left(\frac{r_c \gamma \cos\theta}{2\varepsilon_0}\right)^{1/2} \ln(4d/r_c) \quad (3)$$

As can be seen by examination of equation 3, the required onset voltage is more dependent on the capillary radius than the distance from the counter-electrode.

It would be desirable to define an electrospray device that could form a stable electrospray of all fluids commonly used in CE, CEC, and LC. The surface tension of solvents commonly used as the mobile phase for these separations range from 100% aqueous ($\gamma$=0.073 N/m) to 100% methanol ($\gamma$=0.0226 N/m). As the surface tension of the electrospray fluid increases, a higher onset voltage is required to initiate an electrospray for a fixed capillary diameter. As an example, a capillary with a tip diameter of 14 $\mu$m is required to electrospray 100% aqueous solutions with an onset voltage of 1000 V. The work of M. S. Wilm et al., *Int. J. Mass Spectrom. Ion Processes* 136:167–80 (1994), first demonstrates nanoelectrospray from a fused-silica capillary pulled to an outer diameter of 5 $\mu$m at a flow rate of 25 nL/min. Specifically, a nanoelectrospray at 25 nL/min was achieved from a 2 $\mu$m inner diameter and 5 $\mu$m outer diameter pulled fused-silica capillary with 600-700 V at a distance of 1–2 mm from the ion-sampling orifice of an electrospray equipped mass spectrometer.

Electrospray in front of an ion-sampling orifice of an API mass spectrometer produces a quantitative response from the mass spectrometer detector due to the analyte molecules present in the liquid flowing from the capillary. One advantage of electrospray is that the response for an analyte measured by the mass spectrometer detector is dependent on the concentration of the analyte in the fluid and independent of the fluid flow rate. The response of an analyte in solution at a given concentration would be comparable using electrospray combined with mass spectrometry at a flow rate of 100 $\mu$L/min compared to a flow rate of 100 nL/min. D. C. Gale et al., *Rapid Commun. Mass Spectrom.* 7:1017 (1993) demonstrate that higher electrospray sensitivity is achieved at lower flow rates due to increased analyte ionization efficiency. Thus by performing electrospray on a fluid at flow rates in the nanoliter per minute range provides the best sensitivity for an analyte contained within the fluid when combined with mass spectrometry.

Thus, it is desirable to provide an electrospray device for integration of microchip-based separation devices with API-MS instruments. This integration places a restriction on the capillary tip defining a nozzle on a microchip. This nozzle will, in all embodiments, exist in a planar or near planar geometry with respect to the substrate defining the separation device and/or the electrospray device. When this co-planar or near planar geometry exists, the electric field lines emanating from the tip of the nozzle will not be enhanced if the electric field around the nozzle is not defined and controlled and, therefore, an electrospray is only achievable with the application of relatively high voltages applied to the fluid.

Attempts have been made to manufacture an electrospray device for microchip-based separations. Ramsey et al., *Anal. Chem.* 69:1174–78 (1997) describes a microchip-based separations device coupled with an electrospray mass spectrometer. Previous work from this research group including Jacobson et al., *Anal. Chem.* 66:1114–18 (1994) and Jacobson et al., *Anal. Chem.* 66:2369–73 (1994) demonstrate impressive separations using on-chip fluorescence detection. This more recent work demonstrates nanoelectrospray at 90 nL/min from the edge of a planar glass microchip. The microchip-based separation channel has dimensions of 10 $\mu$m deep, 60 $\mu$m wide, and 33 mm in length. Electroosmotic flow is used to generate fluid flow at 90 nL/min. Application of 4,800 V to the fluid exiting the separation channel on the edge of the microchip at a distance of 3–5 mm from the ion-sampling orifice of an API mass spectrometer generates an electrospray. Approximately 12 nL of the sample fluid collects at the edge of the microchip before the formation of a Taylor cone and stable nanoelectrospray from the edge of the microchip. The volume of this microchip-based separation channel is 19.8 nL. Nanoelectrospray from the edge of this microchip device after capillary electrophoresis or capillary electrochromatography separation is rendered impractical since this system has a dead-volume approaching 60% of the column (channel) volume. Furthermore, because this device provides a flat surface, and, thus, a relatively small amount of physical asperity for the formation of the electrospray, the device requires an impractically high voltage to overcome the fluid surface tension to initiate an electrospray.

Xue, Q. et al., *Anal. Chem.* 69:426–30 (1997) also describes a stable nanoelectrospray from the edge of a planar glass microchip with a closed channel 25 $\mu$m deep, 60 $\mu$m wide, and 35–50 mm in length. An electrospray is formed by applying 4,200 V to the fluid exiting the separation channel on the edge of the microchip at a distance of 3–8 mm from the ion-sampling orifice of an API mass spectrometer. A syringe pump is utilized to deliver the sample fluid to the glass microchip at a flow rate of 100 to 200 nL/min. The edge of the glass microchip is treated with a hydrophobic coating to alleviate some of the difficulties associated with nanoelectrospray from a flat surface that slightly improves the stability of the nanoelectrospray. Nevertheless, the volume of the Taylor cone on the edge of the microchip is too large relative to the volume of the separation channel, making this method of electrospray directly from the edge of a microchip impracticable when combined with a chromatographic separation device.

T. D. Lee et. al., 1997 *International Conference on Solid-State Sensors and Actuators* Chicago, pp. 927–30 (Jun. 16–19, 1997) describes a multi-step process to generate a nozzle on the edge of a silicon microchip 1–3 $\mu$m in diameter or width and 40 $\mu$m in length and applying 4,000 V to the entire microchip at a distance of 0.25–0.4 mm from the ion-sampling orifice of an API mass spectrometer. Because a relatively high voltage is required to form an electrospray with the nozzle positioned in very close proximity to the mass spectrometer ion-sampling orifice, this device produces an inefficient electrospray that does not allow for sufficient droplet evaporation before the ions enter the orifice. The extension of the nozzle from the edge of the microchip also exposes the nozzle to accidental breakage. More recently, T. D. Lee et. al., in 1999 *Twelfth IEEE International Micro Electro Mechanical Systems Conference* (Jan. 17–21, 1999), presented this same concept where the electrospray component was fabricated to extend 2.5 mm beyond the edge of the microchip to overcome this phenomenon of poor electric field control within the proximity of a surface.

Thus, it is also desirable to provide an electrospray device with controllable spraying and a method for producing such a device that is easily reproducible and manufacturable in high volumes.

U.S. Pat. No. 5,501,893 to Laermer et. al., reports a method of anisotropic plasma etching of silicon (Bosch process) that provides a method of producing deep vertical structures that is easily reproducible and controllable. This method of anisotropic plasma etching of silicon incorporates a two step process. Step one is an anisotropic etch step using a reactive ion etching (RIE) gas plasma of sulfur hexafluoride ($SF_6$). Step two is a passivation step that deposits a polymer on the vertical surfaces of the silicon substrate. This polymerizing step provides an etch stop on the vertical surface that was exposed in step one. This two step cycle of etch and passivation is repeated until the depth of the desired structure is achieved. This method of anisotropic plasma etching provides etch rates over 3 µm/min of silicon depending on the size of the feature being etched. The process also provides selectivity to etching silicon versus silicon dioxide or resist of greater than 100:1 which is important when deep silicon structures are desired. Laermer et. al., in 1999 *Twelfth IEEE International Micro Electro Mechanical Systems Conference* (Jan. 17–21, 1999), reported improvements to the Bosch process. These improvements include silicon etch rates approaching 10 µm/min, selectivity exceeding 300:1 to silicon dioxide masks, and more uniform etch rates for features that vary in size.

The area of miniaturized microfluidic technology, also known as "lab-on-a-chip" or "micro total analysis systems" is growing fast with the promise of revolutionizing chemical analysis and offering enabling tools and technologies for the life sciences. The majority of interesting molecules and compounds in the life sciences are in the liquid phase and typically analytical measurements are used to conduct quantitative and qualitative trace analysis of these analytes in solution. The need for the ability to test low sample amounts and volumes is constantly increasing as seen in drug discovery and drug development, including pharmacokinetic and proteomics applications, pushing the need for better analytical measurements. Inherently, microfluidics are a "good fit" for the move to both smaller sample and volume requirements. In fact, the main reason for miniaturization has been to enhance analytical performance of the device rather than reduce its over physical size. Additionally, the miniaturizing analysis with microfluidics allows for integration of multiple separation techniques that enable parallel processing and also for the incorporation of several types of analytical measurements in a single device (sample handling, injections, 2D separations, reaction chambers etc.). Inherently, there are other benefits with the miniaturization such as reduction in reagent and waste disposal as well as the device footprint.

Inherent to microfabrication is alignment of photolithography masks for pattern transfer to the substrate (wafer). For more complex devices, such as electrospray nozzles, several mask steps must be employed for creation of the final device including alignment of several patterning steps using photo masks. Alignment of features is often a critical parameter and the alignment accuracy is a function of the photolithography tool and the need for increased accuracy is often correlated to increased cost. For example, lithography utilizing a stepper tool offers much better pattern-to-pattern alignment than a contact aligner tool, however, at an instrument cost more than an order of magnitude higher. In addition stepper tools require a highly trained operator and maintenance costs are high. A process allowing use of a contact patterning tool allows a lower cost expensive for capital equipment, lower maintenance and operator cost. Additionally, the entire wafer patterning can be conducted with one single exposure opposed to needing multiple exposure by a stepper tool. Exposure cost for a contact alignment tool is independent of wafer size (except the cost of the mask creation itself) whereas a stepper tool cost increases with increasing diameter because of the increased number of exposures. Thus, there are several advantages to being able to use a contact alignment system.

The present invention is directed toward a method for improved lithography for patterning devices that require multiple mask alignment/overlays, for example, when fabricating microchip-based electrospray systems.

SUMMARY OF THE INVENTION

One aspect of the present invention is directed to a method for producing a nozzle of an electrospray device which includes providing a primary mask to accurately define the nozzle feature including the annulus and the through hole of the nozzle followed by the defining and etching of the primary mask containing the full nozzle feature. Then conducting a secondary mask step to repattern the through channel. The secondary mask serves to selectively mask given areas of the primary mask for subsequent etching. The through hole feature of the secondary mask aligns over the already patterned primary mask through channel, except that the secondary mask contains a slightly larger through channel diameter. This serves to mask off the annulus, but allowing the silicon through channel to be exposed for etching. The increased through channel size of the secondary mask feature is determined by the accuracy of the contact alignment tool.

DETAILED DESCRIPTION OF THE INVENTION

Figure 1:
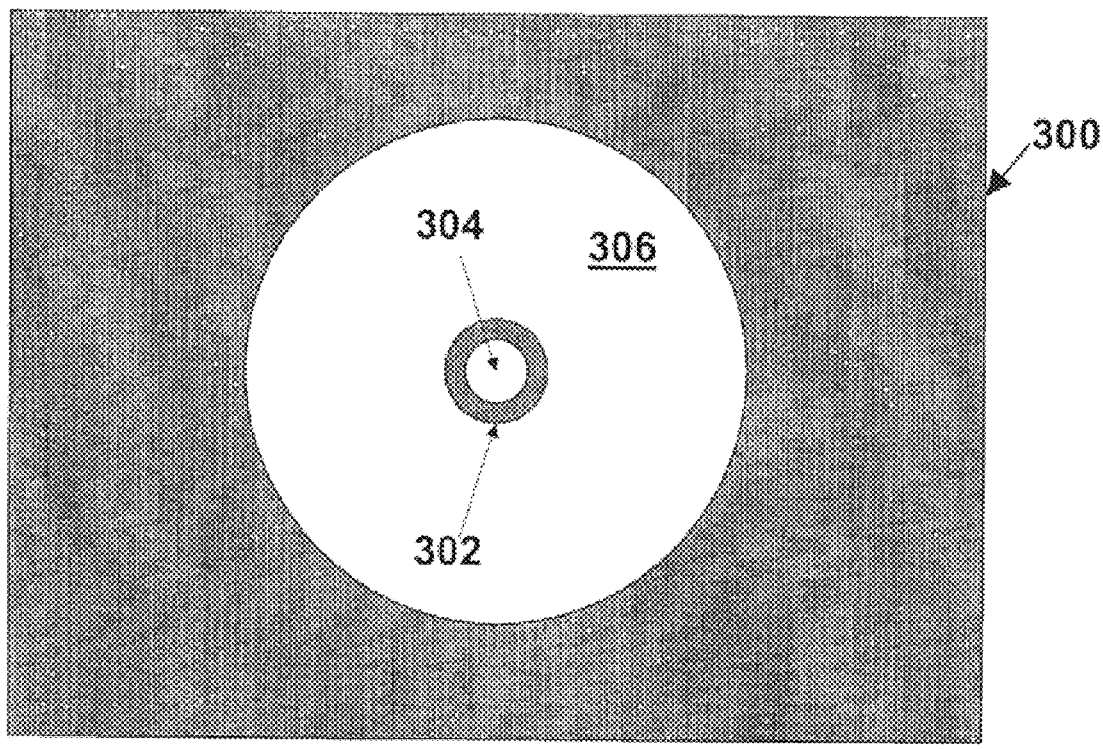
FIG. 1 is a plan view of a nozzle mask of an electrospray device of the present invention.

The electrospray device of the present invention generally includes a silicon substrate material defining a channel between an entrance orifice on an injection surface and a nozzle on an ejection surface (the major surface) such that the electrospray generated by the device is generally perpendicular to the ejection surface. The nozzle has an inner and an outer diameter and is defined by an annular portion recessed from the ejection surface. The recessed annular region extends radially from the outer diameter. The tip of the nozzle is co-planar or level with and does not extend beyond the ejection surface. Thus, the nozzle is protected against accidental breakage. The nozzle, the channel, and the recessed annular region are etched from the silicon substrate by deep reactive-ion etching and other standard semiconductor processing techniques. Fabrication of electrospray devices is disclosed in U.S. patent application Ser. No. 09/468,535, filed Dec. 20, 1999, entitled "Integrated Monolithic Microfabricated Dispensing Nozzle and Liquid Chromatography-Electrospray System and Method" to Schultz et al., and U.S. patent application Ser. No. 09/748,518, filed Dec. 22, 2000, entitled "Multiple Electrospray Device, Systems and Methods" to Schultz et al., which are incorporated herein by reference in their entirety.

All surfaces of the silicon substrate preferably have insulating layers thereon to electrically isolate the liquid sample from the substrate and the ejection and injection surfaces from each other such that different potential voltages may be individually applied to each surface, the silicon substrate and the liquid sample. The insulating layer generally constitutes a silicon dioxide layer combined with a silicon nitride layer. The silicon nitride layer provides a moisture barrier against water and ions from penetrating through to the substrate thus preventing electrical breakdown between a fluid moving in the channel and the substrate. The electrospray apparatus preferably includes at least one controlling electrode electrically contacting the substrate for the application of an electric potential to the substrate.

Preferably, the nozzle, channel and recess are etched from the silicon substrate by reactive-ion etching and other standard semiconductor processing techniques. The injection-side features, through-substrate fluid channel, ejection-side features, and controlling electrodes are formed monolithically from a monocrystalline silicon substrate—i.e., they are formed during the course of and as a result of a fabrication sequence that requires no manipulation or assembly of separate components.

Because the electrospray device is manufactured using reactive-ion etching and other standard semiconductor processing techniques, the dimensions of such a device nozzle can be very small, for example, as small as 2 $\mu$m inner diameter and 5 $\mu$m outer diameter. Thus, a through-substrate fluid channel having, for example, 5 $\mu$m inner diameter and a substrate thickness of 250 $\mu$m only has a volume of 4.9 pL ("picoliters"). The micrometer-scale dimensions of the electrospray device minimize the dead volume and thereby increase efficiency and analysis sensitivity when combined with a separation device.

The electrospray device of the present invention provides for the efficient and effective formation of an electrospray. By providing an electrospray surface (i.e., the tip of the nozzle) from which the fluid is ejected with dimensions on the order of micrometers, the device limits the voltage required to generate a Taylor cone and subsequent electrospray. The nozzle of the electrospray device provides the physical asperity on the order of micrometers on which a large electric field is concentrated. Further, the nozzle of the electrospray device contains a thin region of conductive silicon insulated from a fluid moving through the nozzle by the insulating silicon dioxide and silicon nitride layers. The fluid and substrate voltages and the thickness of the insulating layers separating the silicon substrate from the fluid determine the electric field at the tip of the nozzle. Additional electrode(s) on the ejection surface to which electric potential(s) may be applied and controlled independent of the electric potentials of the fluid and the substrate may be incorporated in order to advantageously modify and optimize the electric field in order to focus the gas phase ions produced by the electrospray.

The microchip-based electrospray device of the present invention provides minimal extra-column dispersion as a result of a reduction in the extra-column volume and provides efficient, reproducible, reliable and rugged formation of an electrospray. This electrospray device is perfectly suited as a means of electrospray of fluids from microchip-based separation devices. The design of this electrospray device is also robust such that the device can be readily mass-produced in a cost-effective, high-yielding process.

The electrospray device may be interfaced to or integrated downstream from a sampling device, depending on the particular application. For example, the analyte may be electrosprayed onto a surface to coat that surface or into another device for purposes of conveyance, analysis, and/or synthesis. As described previously, highly charged droplets are formed at atmospheric pressure by the electrospray device from nanoliter-scale volumes of an analyte. The highly charged droplets produce gas-phase ions upon sufficient evaporation of solvent molecules which may be sampled, for example, through an ion-sampling orifice of an atmospheric pressure ionization mass spectrometer ("API-MS") for analysis of the electrosprayed fluid.

A multi-system chip thus provides a rapid sequential chemical analysis system fabricated using Micro-ElectroMechanical System ("MEMS") technology. The multi-system chip enables automated, sequential separation and injection of a multiplicity of samples, resulting in significantly greater analysis throughput and utilization of the mass spectrometer instrument for high-throughput detection of compounds for drug discovery.

The electrospray device may be interfaced downstream to an atmospheric pressure ionization mass spectrometer ("API-MS") for analysis of the electrosprayed fluid.

The present nozzle system is fabricated using Micro-ElectroMechanical System ("MEMS") fabrication technologies designed to micromachine 3-dimensional features from a silicon substrate. MEMS technology, in particular, deep reactive ion etching ("DRIE"), enables etching of the small vertical features required for the formation of micrometer dimension surfaces in the form of a nozzle for successful nanoelectrospray of fluids. Insulating layers of silicon dioxide and silicon nitride are also used for independent application of an electric field surrounding the nozzle, preferably by application of a potential voltage to a fluid flowing through the silicon device and a potential voltage applied to the silicon substrate. This independent application of a potential voltage to a fluid exiting the nozzle tip and the silicon substrate creates a high electric field, on the order of $10^8$ V/m, at the tip of the nozzle. This high electric field at the nozzle tip causes the formation of a Taylor cone, fluidic jet and highly-charged fluidic droplets characteristic of the electrospray of fluids. These two voltages, the fluid voltage and the substrate voltage, control the formation of a stable electrospray from this microchip-based electrospray device.

The electrical properties of silicon and silicon-based materials are well characterized. The use of silicon dioxide and silicon nitride layers grown or deposited on the surfaces of a silicon substrate are well known to provide electrical insulating properties. Incorporating silicon dioxide and silicon nitride layers in a monolithic silicon electrospray device with a defined nozzle provides for the enhancement of an electric field in and around features etched from a monolithic silicon substrate. This is accomplished by independent application of a voltage to the fluid exiting the nozzle and the region surrounding the nozzle. Silicon dioxide layers may be grown thermally in an oven to a desired thickness. Silicon nitride can be deposited using low pressure chemical vapor deposition ("LPCVD"). Metals may be further vapor deposited on these surfaces to provide for application of a potential voltage on the surface of the device. Both silicon dioxide and silicon nitride function as electrical insulators allowing the application of a potential voltage to the substrate that is different than that applied to the surface of the device. An important feature of a silicon nitride layer is that it provides a moisture barrier between the silicon substrate, silicon dioxide and any fluid sample that comes in contact with the device. Silicon nitride prevents water and ions from diffusing through the silicon dioxide layer to the silicon substrate which may cause an electrical breakdown between the fluid and the silicon substrate. Additional layers of silicon dioxide, metals and other materials may further be deposited on the silicon nitride layer to provide chemical functionality to silicon-based devices.

The nozzle or ejection side of the device and the reservoir or injection side of the device are connected by the through-wafer channels thus creating a fluidic path through the silicon substrate. Fluids may be introduced to this microfabricated electrospray device by a fluid delivery device such as a probe, conduit, capillary, micropipette, microchip, or the like. A probe may be moved into contact with the injection or reservoir side of the electrospray device of the present invention. The probe can have a disposable tip. The probe may have a seal, for example an o-ring, at the tip to form a seal between the probe tip and the injection surface of the substrate. An array of a plurality of electrospray devices may be fabricated on a monolithic substrate. One liquid sample handling device or multiple liquid sampling devices can be utilized to provide one or more fluid samples to one or more electrospray devices in accordance with the present invention. The fluid probe and the substrate can be manipulated in 3-dimensions for staging of, for example, different devices in front of a mass spectrometer or other sample detection apparatus.

To generate an electrospray, fluid may be delivered to the through-substrate channel of the electrospray device by, for example, a capillary, micropipette or microchip. The fluid is subjected to a potential voltage, for example, in the capillary or in the reservoir or via an electrode provided on the reservoir surface and isolated from the surrounding surface region and the substrate. A potential voltage may also be applied to the silicon substrate via the electrode on the edge of the silicon substrate the magnitude of which is preferably adjustable for optimization of the electrospray characteristics. The fluid flows through the channel and exits from the nozzle in the form of a Taylor cone, liquid jet, and very fine, highly charged fluidic droplets.

The nozzle provides the physical asperity to promote the formation of a Taylor cone and efficient electrospray of a fluid. The nozzle also forms a continuation of and serves as an exit orifice of the through-wafer channel. The recessed annular region serves to physically isolate the nozzle from the surface. The present invention allows the optimization of the electric field lines emanating from the fluid exiting the nozzle, for example, through independent control of the potential voltage of the fluid and the potential voltage of the substrate.

The electric field at the nozzle tip can be simulated using SIMION™ ion optics software. SIMION™ allows for the simulation of electric field lines for a defined array of electrodes. For example, fluid flowing through the nozzle and exiting the nozzle tip in the shape of a hemisphere a 20 μm diameter nozzle with a nozzle height of 50 μm has a potential voltage of 1000V. The substrate has a potential voltage of zero volts. A simulated third electrode is located 5 mm from the nozzle side of the substrate and has a potential voltage of zero volts. This third electrode is generally an ion-sampling orifice of an atmospheric pressure ionization mass spectrometer. This simulates the electric field required for the formation of a Taylor cone rather than the electric field required to maintain an electrospray. The simulated electric field at the fluid tip with these dimensions and potential voltages is $8.2 \times 10^7$ V/m. In a nozzle with a fluid potential voltage of 1000V, substrate voltage of zero V and a third electrode voltage of 800 V the electric field at the nozzle tip is $8.0 \times 10^7$ V/m indicating that the applied voltage of this third electrode has little effect on the electric field at the nozzle tip. In a nozzle with a fluid potential voltage of 1000V, substrate voltage of 800 V and a third electrode voltage of 0 V, the electric field at the nozzle tip is reduced significantly to a value of $2.2 \times 10^7$ V/m. This indicates that very fine control of the electric field at the nozzle tip is achieved with this invention by independent control of the applied fluid and substrate voltages and is relatively insensitive to other electrodes placed up to 5 mm from the device. This level of control of the electric field at the nozzle tip is of significant importance for electrospray of fluids from a nozzle co-planar with the surface of a substrate.

This fine control of the electric field allows for precise control of the electrospray of fluids from these nozzles. When electrospraying fluids from this invention, this fine control of the electric field allows for a controlled formation of multiple Taylor cones and electrospray plumes from a single nozzle. By simply increasing the fluid voltage while maintaining the substrate voltage at zero V, the number of electrospray plumes emanating from one nozzle can be stepped from one to four.

The high electric field at the nozzle tip applies a force to ions contained within the fluid exiting the nozzle. This force pushes positively-charged ions to the fluid surface when a positive voltage is applied to the fluid relative to the substrate potential voltage. Due to the repulsive force of likely-charged ions, the surface area of the Taylor cone generally defines and limits the total number of ions that can reside on the fluidic surface. It is generally believed that, for electrospray, a gas phase ion for an analyte can most easily be formed by that analyte when it resides on the surface of the fluid. The total surface area of the fluid increases as the number of Taylor cones at the nozzle tip increases resulting in the increase in solution phase ions at the surface of the fluid prior to electrospray formation. The ion intensity will increase as measured by the mass spectrometer when the number of electrospray plumes increase as shown in the example above.

Another important feature of the present invention is that since the electric field around each nozzle is preferably defined by the fluid and substrate voltage at the nozzle tip, multiple nozzles can be located in close proximity, on the order of tens of microns. This novel feature of the present invention allows for the formation of multiple electrospray plumes from multiple nozzles of a single fluid stream thus greatly increasing the electrospray sensitivity available for microchip-based electrospray devices. Multiple nozzles of an electrospray device in fluid communication with one another not only improve sensitivity but also increase the flow rate capabilities of the device. For example, the flow rate of a single fluid stream through one nozzle having the dimensions of a 10 micron inner diameter, 20 micron outer diameter, and a 50 micron length is about 1 $\mu$L/min.; and the flow rate through 200 of such nozzles is about 200 $\mu$L/min. Accordingly, devices can be fabricated having the capacity for flow rates up to about 2 $\mu$L/min., from about 2 $\mu$L/min. to about 1 mL/min., from about 100 nL/min. to about 500 nL/min., and greater than about 2 $\mu$L/min. possible.

Arrays of multiple electrospray devices having any nozzle number and format may be fabricated according to the present invention. The electrospray devices can be positioned to form from a low-density array to a high-density array of devices. Arrays can be provided having a spacing between adjacent devices of 9 mm, 4.5 mm, 2.25 mm, 1.12 mm, 0.56 mm, 0.28 mm, and smaller to a spacing as close as about 50 $\mu$m apart, respectively, which correspond to spacing used in commercial instrumentation for liquid handling or accepting samples from electrospray systems. Similarly, systems of electrospray devices can be fabricated in an array having a device density exceeding about 5 devices/cm$^2$, exceeding about 16 devices/cm$^2$, exceeding about 30 devices/cm$^2$, and exceeding about 81 devices/cm$^2$, preferably from about 30 devices/cm$^2$ to about 100 devices/cm$^2$.

Dimensions of the electrospray device can be determined according to various factors such as the specific application, the layout design as well as the upstream and/or downstream device to which the electrospray device is interfaced or integrated. Further, the dimensions of the channel and nozzle may be optimized for the desired flow rate of the fluid sample. The use of reactive-ion etching techniques allows for the reproducible and cost effective production of small diameter nozzles, for example, a 2 $\mu$m inner diameter and 5 $\mu$m outer diameter. Such nozzles can be fabricated as close as 20 $\mu$m apart, providing a density of up to about 160,000 nozzles/cm$^2$. Nozzle densities up to about 10,000/cm$^2$, up to about 15,625/cm$^2$, up to about 27,566/cm$^2$, and up to about 40,000/cm$^2$, respectively, can be provided within an electrospay device. Similarly, nozzles can be provided wherein the spacing on the ejection surface between the centers of adjacent exit orifices of the spray units is less than about 500 $\mu$m, less than about 200 $\mu$m, less than about 100 $\mu$m, and less than about 50 $\mu$m, respectively. For example, an electrospray device having one nozzle with an outer diameter of 20 $\mu$m would respectively have a surrounding sample well 30 $\mu$m wide. A densely packed array of such nozzles could be spaced as close as 50 $\mu$m apart as measured from the nozzle center.

In one currently preferred embodiment, the silicon substrate of the electrospray device is approximately 250–500 $\mu$m in thickness and the cross-sectional area of the through-substrate channel is less than approximately 2,500 $\mu$m$^2$. Where the channel has a circular cross-sectional shape, the channel and the nozzle have an inner diameter of up to 50 $\mu$m, more preferably up to 30 $\mu$m; the nozzle has an outer diameter of up to 60 $\mu$m, more preferably up to 40 $\mu$m; and nozzle has a height of (and the annular region has a depth of) up to 100 $\mu$m. The recessed portion preferably extends up to 300 $\mu$m outwardly from the nozzle. The silicon dioxide layer has a thickness of approximately 1–4 $\mu$m, preferably 1–3 $\mu$m. The silicon nitride layer has a thickness of approximately less than 2 $\mu$m.

Furthermore, the electrospray device may be operated to produce larger, minimally-charged droplets. This is accomplished by decreasing the electric field at the nozzle exit to a value less than that required to generate an electrospray of a given fluid. Adjusting the ratio of the potential voltage of the fluid and the potential voltage of the substrate controls the electric field. A fluid to substrate potential voltage ratio approximately less than 2 is preferred for droplet formation. The droplet diameter in this mode of operation is controlled by the fluid surface tension, applied voltages and distance to a droplet receiving well or plate. This mode of operation is ideally suited for conveyance and/or apportionment of a multiplicity of discrete amounts of fluids, and may find use in such devices as ink jet printers and equipment and instruments requiring controlled distribution of fluids.

The electrospray device of the present invention includes a silicon substrate material defining a channel between an entrance orifice on a reservoir surface and a nozzle on a nozzle surface such that the electrospray generated by the device is generally perpendicular to the nozzle surface. The nozzle has an inner and an outer diameter and is defined by an annular portion recessed from the surface. The recessed annular region extends radially from the nozzle outer diameter. The tip of the nozzle is co-planar or level with and preferably does not extend beyond the substrate surface. In this manner the nozzle can be protected against accidental breakage. The nozzle, channel, reservoir and the recessed annular region are etched from the silicon substrate by reactive-ion etching and other standard semiconductor processing techniques.

All surfaces of the silicon substrate preferably have insulating layers to electrically isolate the liquid sample from the substrate such that different potential voltages may be individually applied to the substrate and the liquid sample. The insulating layers can constitute a silicon dioxide layer combined with a silicon nitride layer. The silicon nitride layer provides a moisture barrier against water and ions from penetrating through to the substrate causing electrical breakdown between a fluid moving in the channel and the substrate. The electrospray apparatus preferably includes at least one controlling electrode electrically contacting the substrate for the application of an electric potential to the substrate.

Preferably, the nozzle, channel and recess are etched from the silicon substrate by reactive-ion etching and other standard semiconductor processing techniques. The nozzle side features, through-substrate fluid channel, reservoir side features, and controlling electrodes are preferably formed monolithically from a monocrystalline silicon substrate—i.e., they are formed during the course of and as a result of a fabrication sequence that requires no manipulation or assembly of separate components.

Because the electrospray device is manufactured using reactive-ion etching and other standard semiconductor processing techniques, the dimensions of such a device can be very small, for example, as small as 2 $\mu$m inner diameter and 5 $\mu$m outer diameter. Thus, a through-substrate fluid channel having, for example, 5 $\mu$m inner diameter and a substrate thickness of 250 $\mu$m only has a volume of 4.9 pL. The micrometer-scale dimensions of the electrospray device minimize the dead volume and thereby increase efficiency and analysis sensitivity when combined with a separation device.

The electrospray device of the present invention provides for the efficient and effective formation of an electrospray. By providing an electrospray surface from which the fluid is ejected with dimensions on the order of micrometers, the electrospray device limits the voltage required to generate a Taylor cone as the voltage is dependent upon the nozzle diameter, the surface tension of the fluid, and the distance of the nozzle from an extracting electrode. The nozzle of the electrospray device provides the physical asperity on the order of micrometers on which a large electric field is concentrated. Further, the electrospray device may provide additional electrode(s) on the ejecting surface to which electric potential(s) may be applied and controlled independent of the electric potentials of the fluid and the extracting electrode in order to advantageously modify and optimize the electric field in order to focus the gas phase ions resulting from electrospray of fluids. The combination of the nozzle and the additional electrode(s) thus enhance the electric field between the nozzle, the substrate and the extracting electrode. The electrodes are preferable positioned within about 500 microns, and more preferably within about 200 microns from the exit orifice.

The microchip-based electrospray device of the present invention provides minimal extra-column dispersion as a result of a reduction in the extra-column volume and provides efficient, reproducible, reliable and rugged formation of an electrospray. This electrospray device is perfectly suited as a means of electrospray of fluids from microchip-based separation devices. The design of this electrospray device is also robust such that the device can be readily mass-produced in a cost-effective, high-yielding process.

In operation, a conductive or partly conductive liquid sample is introduced into the through-substrate channel entrance orifice on the injection surface. The liquid is held at a potential voltage, either by means of a conductive fluid delivery device to the electrospray device or by means of an electrode formed on the injection surface isolated from the surrounding surface region and from the substrate. The electric field strength at the tip of the nozzle is enhanced by the application of a voltage to the substrate and/or the ejection surface, preferably zero volts up to approximately less than one-half of the voltage applied to the fluid. Thus, by the independent control of the fluid/nozzle and substrate/ejection surface voltages, the electrospray device of the present invention allows the optimization of the electric field emanating from the nozzle. The electrospray device of the present invention may be placed 1–2 mm or up to 10 mm from the orifice of an atmospheric pressure ionization ("API") mass spectrometer to establish a stable nanoelectrospray at flow rates in the range of a few nanoliters per minute.

The electrospray device may be interfaced or integrated downstream to a sampling device, depending on the particular application. For example, the analyte may be electrosprayed onto a surface to coat that surface or into another device for purposes of conveyance, analysis, and/or synthesis. As described above, highly charged droplets are formed at atmospheric pressure by the electrospray device from nanoliter-scale volumes of an analyte. The highly charged droplets produce gas-phase ions upon sufficient evaporation of solvent molecules which may be sampled, for example, through an ion-sampling orifice of an atmospheric pressure ionization mass spectrometer ("API-MS") for analysis of the electrosprayed fluid.

One embodiment of the present invention is in the form of an array of multiple electrospray devices which allows for massive parallel processing. The multiple electrospray devices or systems fabricated by massively parallel processing on a single wafer may then be cut or otherwise separated into multiple devices or systems.

The electrospray device may also serve to reproducibly distribute and deposit a sample from a mother plate to daughter plate(s) by nanoelectrospray deposition or by the droplet method. A chip-based combinatorial chemistry system including a reaction well block may define an array of reservoirs for containing the reaction products from a combinatorially synthesized compound. The reaction well block further defines channels, nozzles and recessed portions such that the fluid in each reservoir may flow through a corresponding channel and exit through a corresponding nozzle in the form of droplets. The reaction well block may define any number of reservoir(s) in any desirable configuration, each reservoir being of a suitable dimension and shape. The volume of a reservoir may range from a few picoliters up to several microliters.

The reaction well block may serve as a mother plate to interface to a microchip-based chemical synthesis apparatus such that the droplet method of the electrospray device may be utilized to reproducibly distribute discreet quantities of the product solutions to a receiving or daughter plate. The daughter plate defines receiving wells that correspond to each of the reservoirs. The distributed product solutions in the daughter plate may then be utilized to screen the combinatorial chemical library against biological targets.

The electrospray device may also serve to reproducibly distribute and deposit an array of samples from a mother plate to daughter plates, for example, for proteomic screening of new drug candidates. This may be by either droplet formation or electrospray modes of operation. Electrospray device(s) may be etched into a microdevice capable of synthesizing combinatorial chemical libraries. At a desired time, a nozzle(s) may apportion a desired amount of a sample(s) or reagent(s) from a mother plate to a daughter plate(s). Control of the nozzle dimensions, applied voltages, and time provide a precise and reproducible method of sample apportionment or deposition from an array of nozzles, such as for the generation of sample plates for molecular weight determinations by matrix-assisted laser desorption/ionization time-of-flight mass spectrometry ("MALDI-TOFMS"). The capability of transferring analytes from a mother plate to daughter plates may also be utilized to make other daughter plates for other types of assays, such as proteomic screening. The fluid to substrate potential voltage ratio can be chosen for formation of an electrospray or droplet mode based on a particular application.

An array of multiple electrospray devices can be configured to disperse ink for use in an ink jet printer. The control and enhancement of the electric field at the exit of the nozzles on a substrate will allow for a variation of ink apportionment schemes including the formation of droplets approximately two times the nozzle diameters or of submicrometer, highly-charged droplets for blending of different colors of ink.

The electrospray device of the present invention can be integrated with miniaturized liquid sample handling devices for efficient electrospray of the liquid samples for detection using a mass spectrometer. The electrospray device may also be used to distribute and apportion fluid samples for use with high-throughput screen technology. The electrospray device may be chip-to-chip or wafer-to-wafer bonded to plastic, glass, or silicon microchip-based liquid separation devices capable of, for example, capillary electrophoresis, capillary electrochromatography, affinity chromatography, liquid chromatography ("LC"), or any other condensed-phase separation technique.

An array or matrix of multiple electrospray devices of the present invention may be manufactured on a single microchip as silicon fabrication using standard, well-controlled thin-film processes. This not only eliminates handling of such micro components but also allows for rapid parallel processing of functionally similar elements. The low cost of these electrospray devices allows for one-time use such that cross-contamination from different liquid samples may be eliminated.

The deposition of a discreet sample onto an electrospray device of the present invention can be accomplished by a fluidic probe depositing or transferring a sample to a reservoir on the injection surface. The fluidic sample is delivered to the reservoir as a discreet volume generally less than 100 nL. The fluidic sample volume evaporates leaving the analytes on the reservoir surface. This reservoir surface may be coated with a retentive phase, such as a hydrophobic C18-like phase commonly used for LC applications, for increasing the partition of analytes contained within the fluid to the reservoir surface. A fluidic probe sealed against the injection surface delivers a fluidic mobile phase to the microchip to reconstitute the transferred analytes for analysis by electrospray mass spectrometry. The probe can have a disposable tip, such as a capillary, micropipette, or microchip.

A multi-system chip thus provides a rapid sequential chemical analysis system fabricated using Micro-ElectroMechanical System ("MEMS") technology. For example, the multi-system chip enables automated, sequential separation and injection of a multiplicity of samples, resulting in significantly greater analysis throughput and utilization of the mass spectrometer instrument for, for example, high-throughput detection of compounds for drug discovery.

Another aspect of the present invention provides a silicon microchip-based electrospray device for producing electrospray of a liquid sample. The electrospray device may be interfaced downstream to an atmospheric pressure ionization mass spectrometer ("API-MS") for analysis of the electrosprayed fluid. Another aspect of the invention is an integrated miniaturized liquid phase separation device, which may have, for example, glass, plastic or silicon substrates integral with the electrospray device.

The electrospray device is preferably fabricated as a monolithic silicon substrate utilizing well-established, controlled thin-film silicon processing techniques such as thermal oxidation, photolithography, reactive-ion etching (RIE), chemical vapor deposition, ion implantation, and metal deposition. Fabrication using such silicon processing techniques facilitates massively parallel processing of similar devices, is time- and cost-efficient, allows for tighter control of critical dimensions, is easily reproducible, and results in a wholly integral device, thereby eliminating any assembly requirements. Further, the fabrication sequence may be easily extended to create physical aspects or features on the injection surface and/or ejection surface of the electrospray device to facilitate interfacing and connection to a fluid delivery system or to facilitate integration with a fluid delivery sub-system to create a single integrated system.

A primary mask is used to accurately define the nozzle feature including the annulus and the through hole of the electrospray device. Typically, the primary mask is a hard mask, such as silicon dioxide. A secondary masking step is conducted using either a soft or hard mask to pattern the through channel (typical the photoresist would serve as the secondary mask), followed by the defining and etching of the primary mask containing the full nozzle feature. This allows for utilization of the two masks for the etching of the nozzle with greater alignment tolerances. The placement and definition of features are conducted with the primary mask. The secondary mask is aligned to an alignment feature in the primary mask. The secondary mask serves to selectively mask given areas of the primary mask for subsequent etching. The through hole feature of the secondary mask aligns over the already patterned primary mask through channel, except that the secondary mask contains a slightly larger through channel diameter. This serves to mask off the annulus, but allowing the silicon through channel to be exposed for etching. The increased through channel size of the secondary mask feature is determined by the accuracy of the contact alignment tool. The etched features on this side of the substrate are ultimately defined by the primary mask. The secondary mask pattern serves to mask a given area of the primary mask, e.g., the area which becomes the through channel. The secondary mask pattern includes all the margins of the desired primary mask pattern it overlies in addition to a border area outside the primary mask pattern. Thus, the etched feature is determined by the primary mask and results in a very controlled patterning process.

In accordance with this embodiment, the method of fabrication allows less stringent alignment requirements for the patterning of a nozzle formed out of a monolithic silicon substrate. The invention allows for less stringent alignment tolerances for the formation of a microsized electrospray nozzle using a multi-mask alignment process, which may be patterned by either a contact alignment or stepper tool. The process allows for less stringent alignment parameters of from about hundreds of nanomaters to microns using a 5×stepper. The process also allows for an all-contact process eliminating the need for an expensive stepper-patterning tool. The nozzle feature is etched last and therefore the most fragile part of the device is not exposed to other prior processing steps resulting in a higher device yields. The present invention is suitable for use with any lithography techniques and pattern transfer procedures, wherein more than one masking step is required, for example, when multiple etches are required.

The process of a first embodiment requires better alignment because the resist mask for the through hole feature is the same size as the pre-patterned underlying oxide mask. Therefore any misalignments of the resist through hole channel resist mask will cause the dimension of the nozzle to be changed from its desired shape and dimension. Any misalignments can cause the inner diameter of the nozzle to become smaller and the through hole feature to not be round.

The through hole resist pattern is larger than the through hole dimension of the oxide pattern patterned hole. The resist patterned through hole is the diameter of the oxide-patterned hole plus the dimension of the nozzle wall. This allows for the alignment error to be one half times the dimension of the nozzle wall. An example would be for a 12 micron inner diameter with a 20 micron outer diameter nozzle, the alignment error could be 3 microns. This makes the process amenable to a contact aligner as well as stepper lithography tools. This approach requires that the underlying hard mask be able to mask the substrate for the through hole etch as well as the nozzle etch. See FIG. 14, for a diagram of the alignment.

Descriptions of the application and general process steps are provided as examples. Modifications to the preferred embodiments will be recognized by those skilled in the art. General principles defined herein may be applied to other applications and embodiments without departing from the scope of the invention. The invention described here is not intended to be limited to the embodiments shown, but is to be accorded the scope consistent with the principles and applications disclosed in this embodiment.

FIGS. 1–23 illustrate the processing steps for fabricating the electrospray device in accordance with the present invention. An electrospray device having a single nozzle is shown for illustrative purposes and is not meant to limit the scope of the invention. Electrospray devices having any desired number of nozzles can be fabricated in accordance with the second embodiment.

Figure 2:
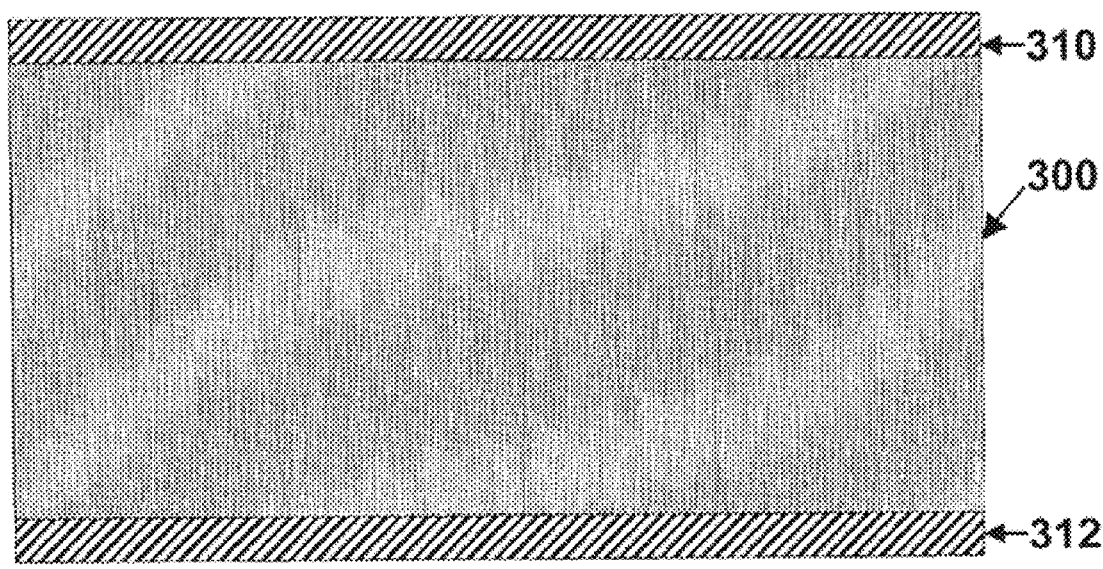
FIG. 2 is the cross-sectional view of FIG. 1 showing silicon dioxide 310 on the nozzle side and a layer or film of silicon dioxide 312 on the reservoir side of the substrate 300.

A mask, as shown in FIG. 1, is used to pattern 302 that will form the nozzle shape in the completed electrospray device. The pattern in the form of circles 304 and 306 forms a through-wafer channel and a recessed annular space around the nozzle, respectively of a completed electrospray device. FIG. 2 is the cross-sectional view of the substrate shown in FIG. 1. A double-side polished silicon wafer 300 is subjected to an elevated temperature in an oxidizing environment to grow a layer or film of silicon dioxide 310 on the nozzle side and a layer or film of silicon dioxide 312 on the reservoir side of the substrate 300. Each of the resulting silicon dioxide layers 310 and 312 has a thickness of approximately 1–3 $\mu$m. The silicon dioxide layers 310 and 312 serve as masks for subsequent selective etching of certain areas of the silicon substrate 300.

Figure 3:
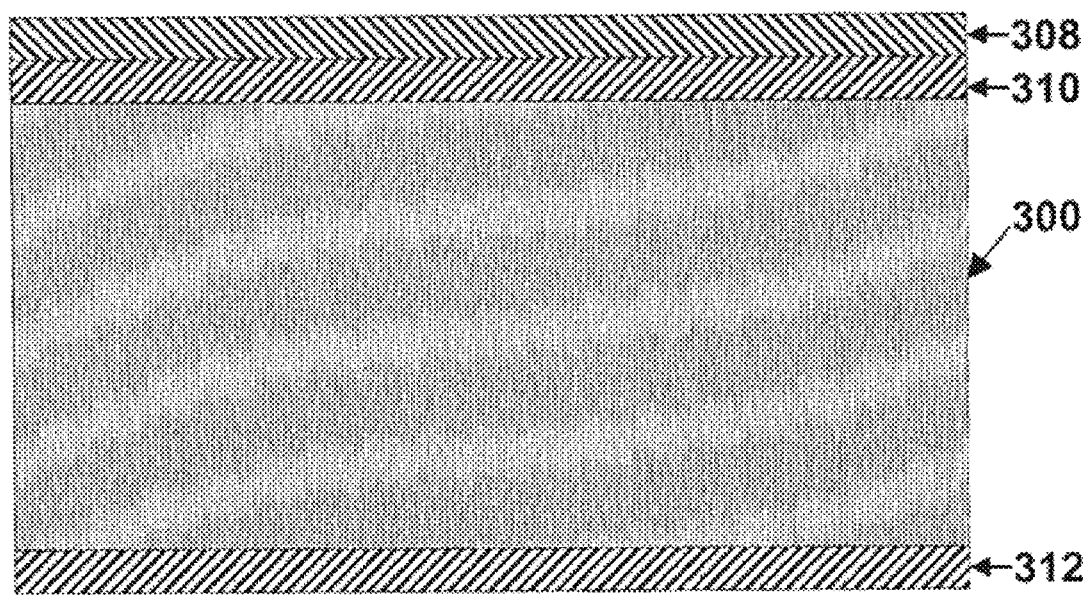
FIG. 3 is a cross-sectional view showing photoresist 308 deposited on the silicon dioxide layer 310 on the nozzle side of substrate 300.
Figure 4:
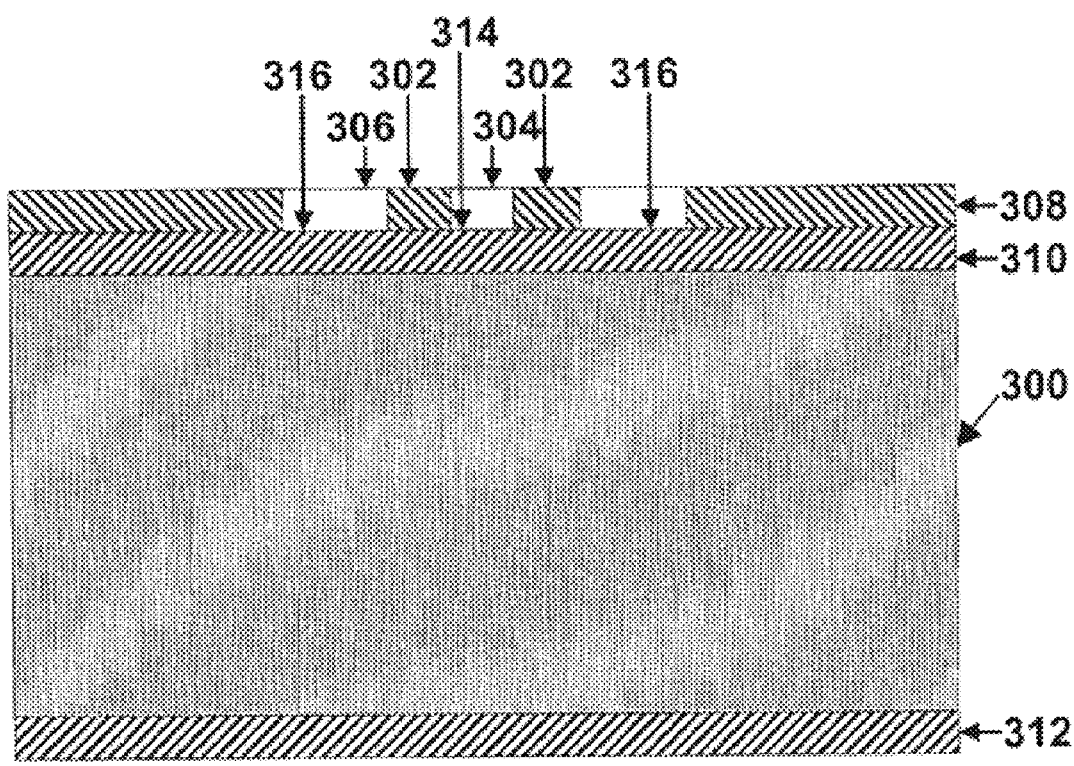
FIG. 4 is a cross-sectional view showing photoresist 304 removed corresponding to the entrance to later formed through-wafer channel and open to the underlying silicon dioxide layer 314 and the exposed area 306 of the photoresist removed and open to the underlying silicon dioxide layer 316.

A film of positive-working photoresist 308 is deposited on the silicon dioxide layer 310 on the nozzle side of the substrate 300, as shown in FIG. 3. Referring to FIG. 4, an area of the photoresist 304 corresponding to the entrance to through-wafer channel and an area of photoresist corresponding to the recessed annular region 306 which will be subsequently etched is selectively exposed through a mask (FIG. 1) by an optical lithographic exposure tool passing short-wavelength light, such as blue or near-ultraviolet at wavelengths of 365, 405, or 436 nanometers.

Figure 5:
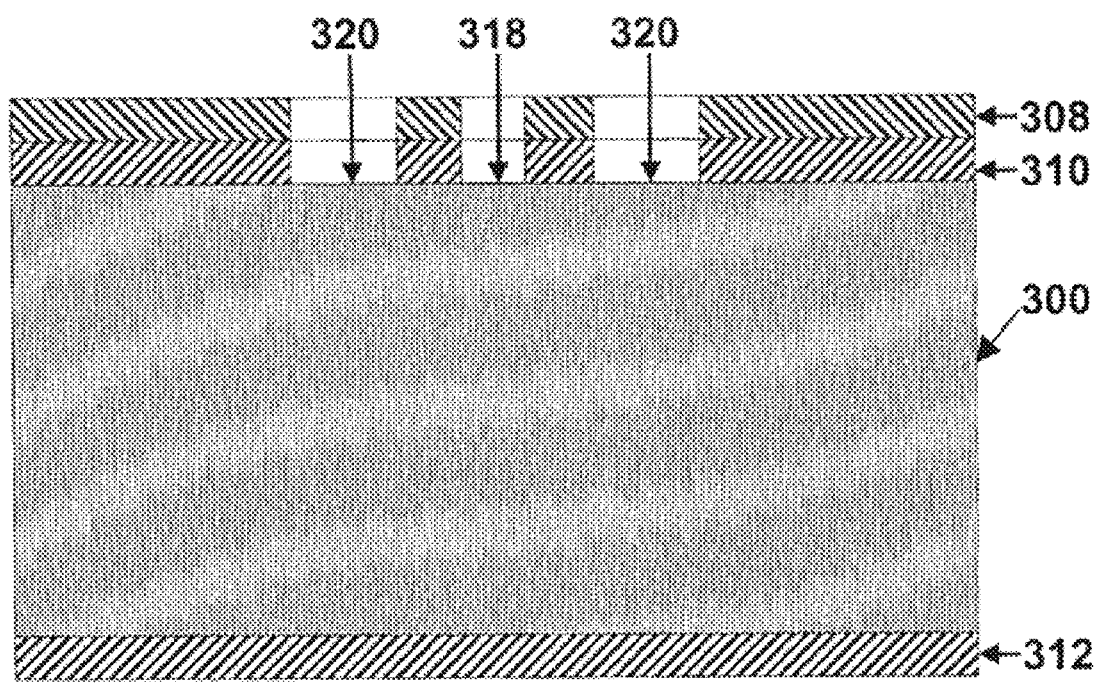
FIG. 5 is a cross-sectional view showing the exposed areas 314, 316 of the silicon dioxide layer 310 removed to expose the silicon substrate 318 and 320.
Figure 6:
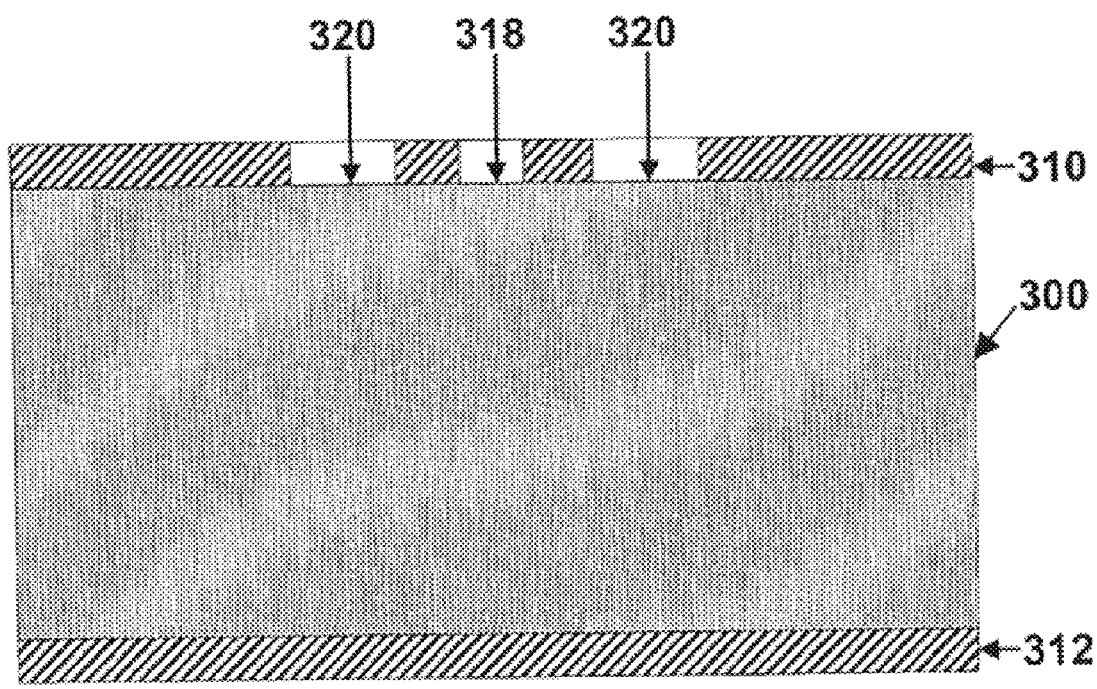
FIG. 6 is a cross-sectional view showing the remaining photoresist 308 removed from the silicon substrate 300.

As shown in the cross-sectional view of FIG. 4, after development of the photoresist 308, the exposed area 304 of the photoresist is removed and open to the underlying silicon dioxide layer 314 and the exposed area 306 of the photoresist is removed and open to the underlying silicon dioxide layer 316, while the unexposed areas remain protected by photoresist 308. Referring to FIG. 5, the exposed areas 314, 316 of the silicon dioxide layer 310 is then etched by a fluorine-based plasma with a high degree of anisotropy and selectivity to the protective photoresist 308 until the silicon substrate 318 and 320 are reached. As shown in the cross-sectional view of FIG. 6, the remaining photoresist 308 is removed from the silicon substrate 300.

Figure 7:
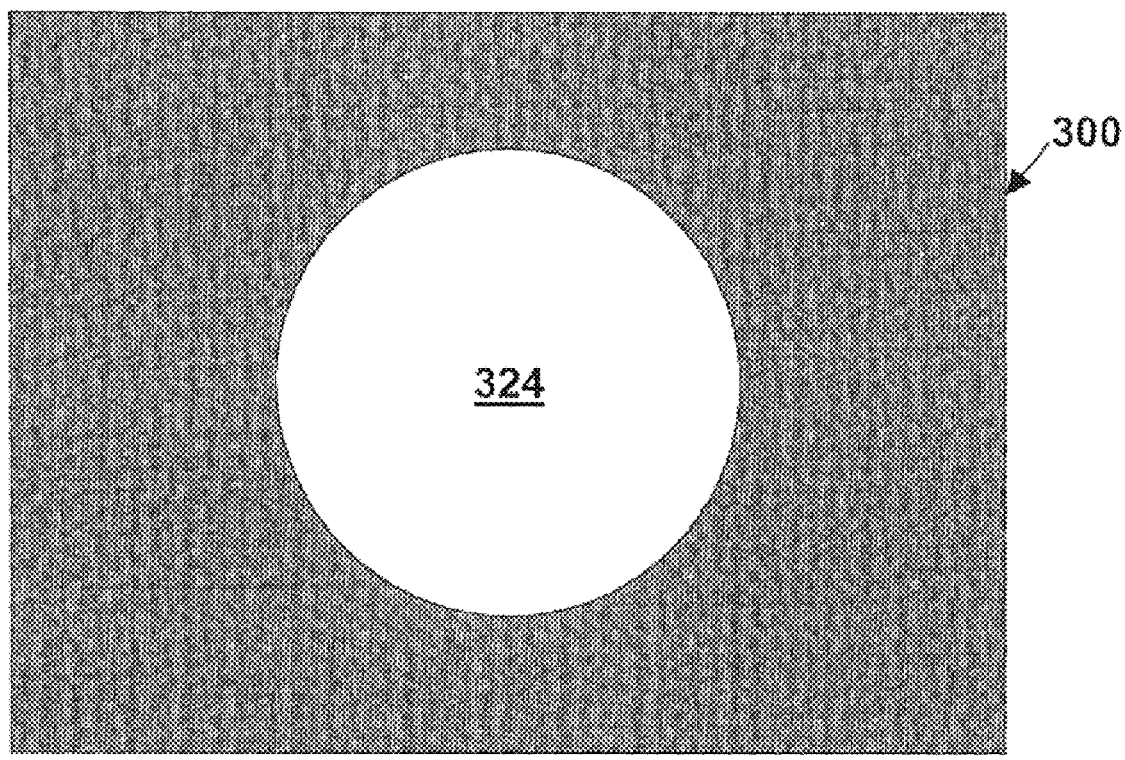
FIG. 7 is a plan view of a reservoir mask of an electrospray device.

Referring to the plan view of FIG. 7 a mask is used to pattern reservoir 324 of an electrospray device. The pattern on the reservoir side is aligned to those previously formed on the nozzle side of the substrate using through-substrate alignments. After alignment, an area of the photoresist corresponding to the circular reservoir 324 is selectively exposed through the mask shown in FIG. 7 by an optical lithographic exposure tool passing short-wavelength light, such as blue or near-ultraviolet at wavelengths of 365, 405, or 436 nanometers.

Figure 8:
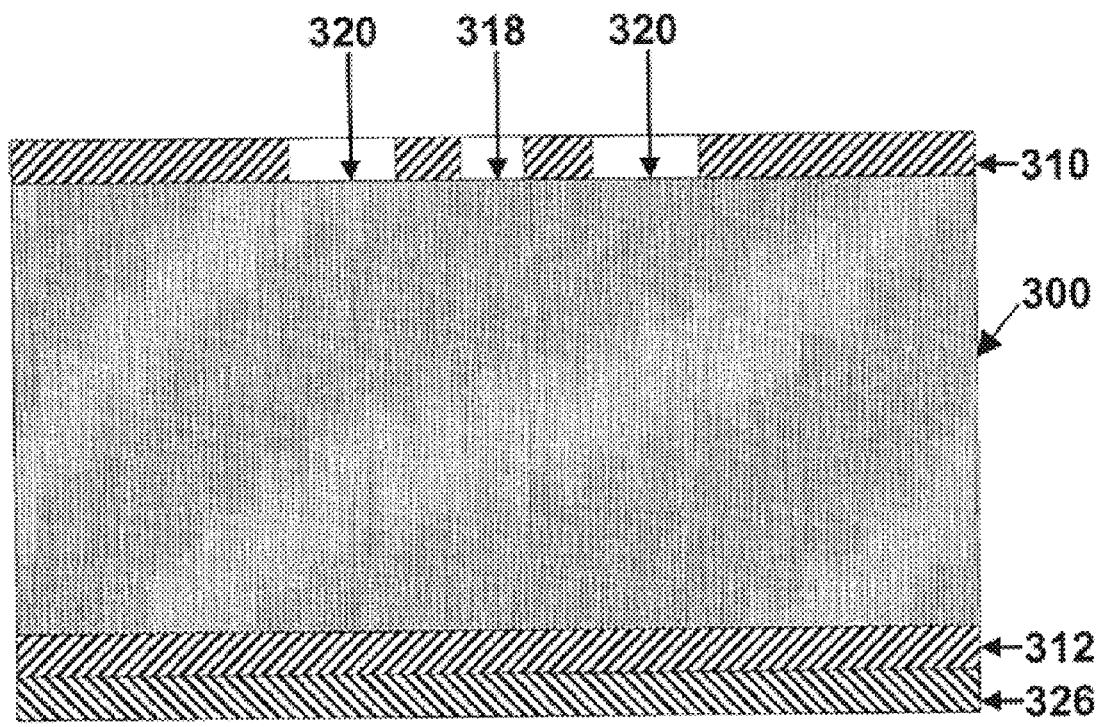
FIG. 8 is a cross-sectional view of the silicon substrate 300 showing silicon dioxide layer 312, photoresist layer 326, and the nozzle pattern etched in silicon dioxide layer 310 after photoresist layer 308 has been removed.

FIG. 8 is a cross-sectional view of the silicon substrate 300 showing silicon dioxide layer 312, photoresist layer 326, and the nozzle pattern etched in silicon dioxide layer 310. As shown in the cross-sectional view in FIG. 8, a film of positive-working photoresist 326 is deposited on the silicon dioxide layer 312. Patterns on the reservoir side are aligned to those previously formed on the nozzle side of the substrate using through-substrate alignments.

After alignment, an area of the photoresist 326 corresponding to the circular reservoir 324 is selectively exposed through a mask (FIG. 7) by an optical lithographic exposure tool passing short-wavelength light, such as blue or near-ultraviolet at wavelengths of 365, 405, or 436 nanometers.

Figure 9:
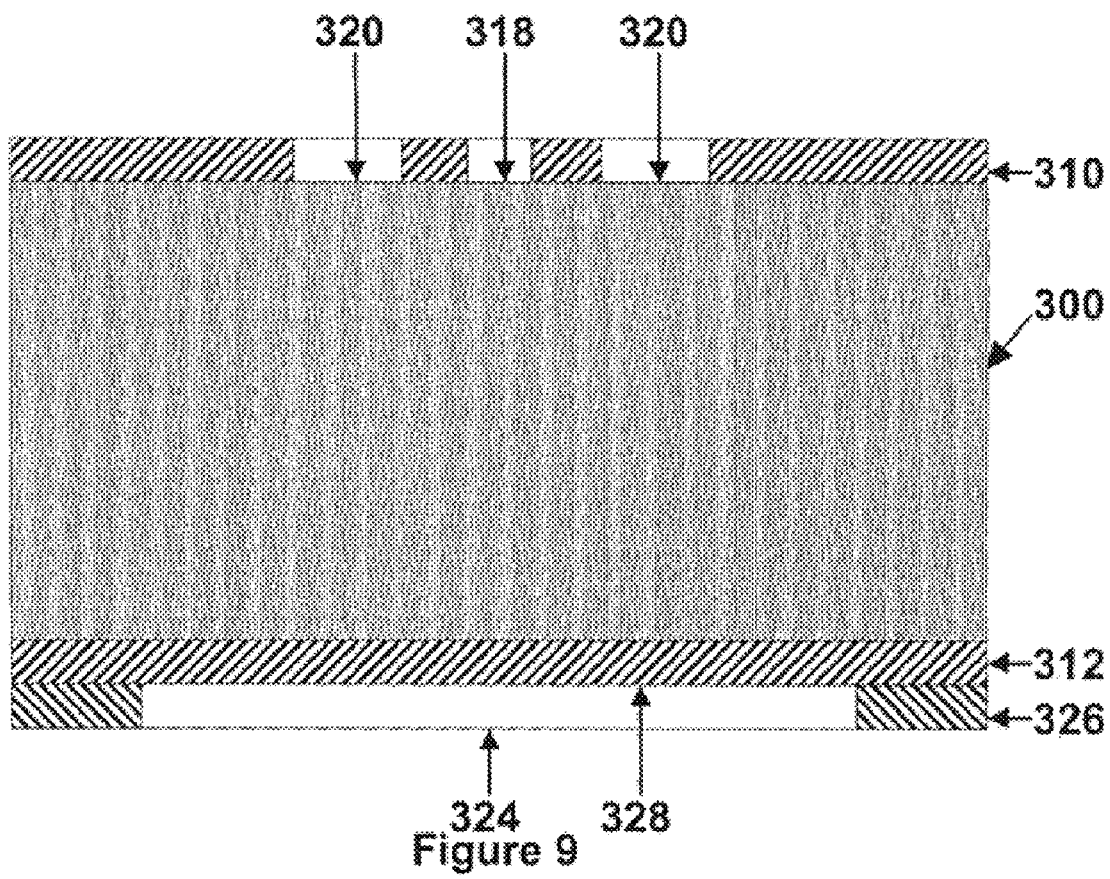
FIG. 9 is a cross-sectional view of the silicon substrate 300 showing removal of photoresist 326 from the region 324 to expose silicon oxide 328 in the pattern of 324.

FIG. 9 is a cross-sectional view of the silicon substrate 300 showing removal of photoresist 326 from the region 324 to expose silicon oxide 328 in the pattern of 324. As shown in the cross-sectional view of FIG. 9, the photoresist 326 is then developed to remove the exposed areas of the photoresist 324 such that the reservoir region is open to the underlying silicon dioxide layer 328, while the unexposed areas remain protected by photoresist 326. The exposed area 328 of the silicon dioxide layer 312 is then etched by a fluorine-based plasma with a high degree of anisotropy and selectivity to the protective photoresist 326 until the silicon substrate 330 is reached as shown in FIG. 10.

Figure 10:
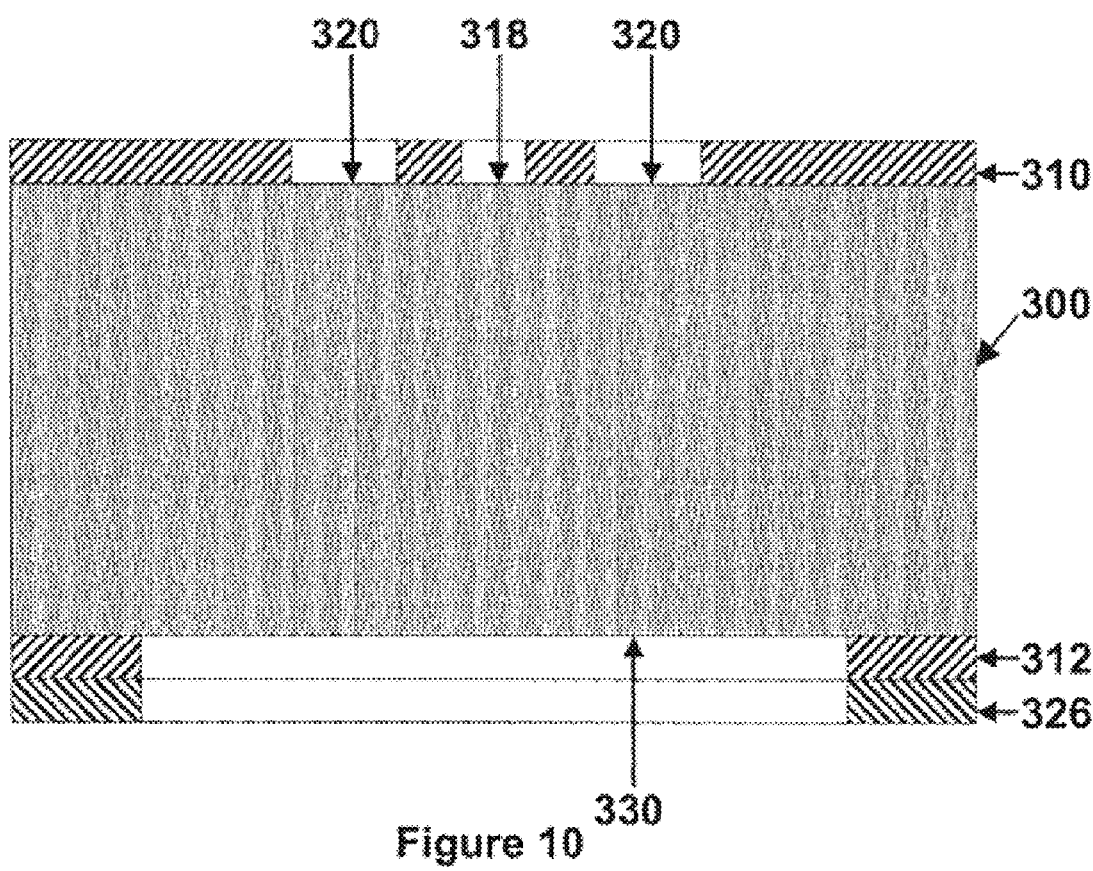
FIG. 10 is a cross-sectional view of the silicon substrate 300 showing removal of silicon dioxide 312 from the region 324 to expose the silicon substrate 330 in the pattern of 324.

FIG. 10 is a cross-sectional view of the silicon substrate 300 showing removal of silicon dioxide 312 from the region 324 to expose the silicon substrate 330 in the pattern of 324.

Figure 11:
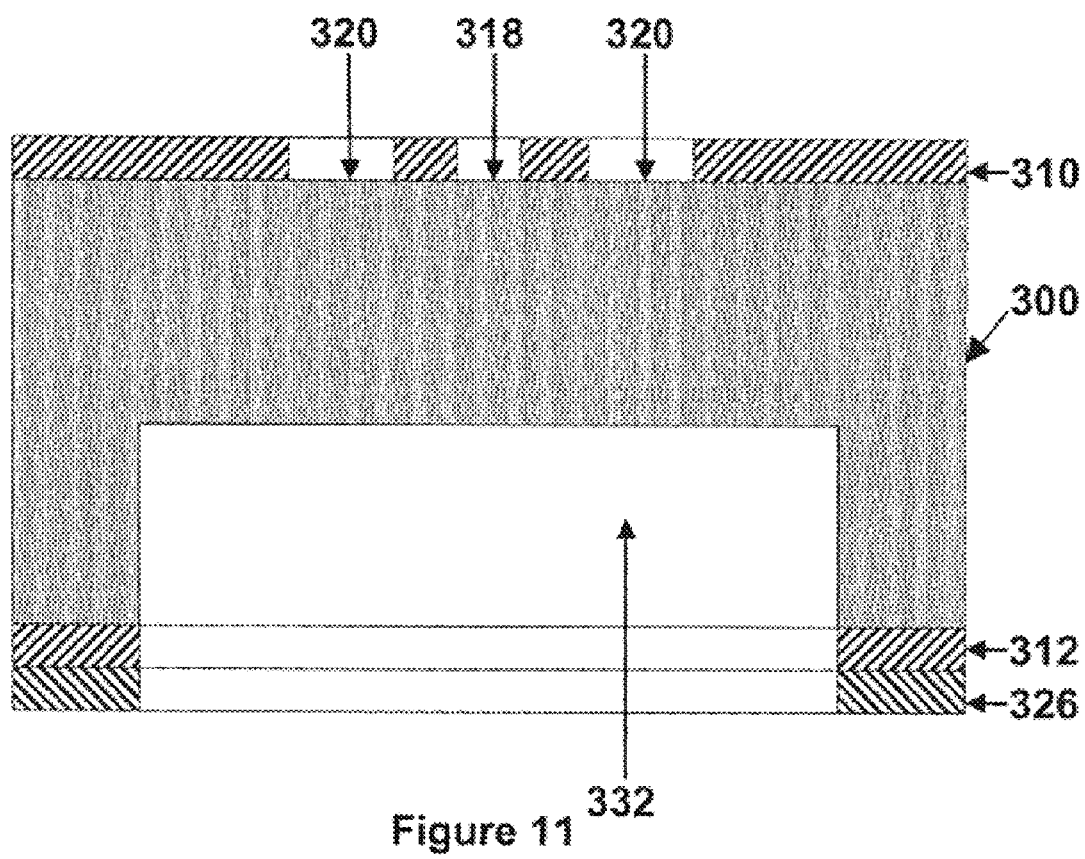
FIG. 11 is a cross-sectional view of the silicon substrate 300 showing removal of silicon substrate 300 from the region 332 in the pattern of 324.
Figure 12:
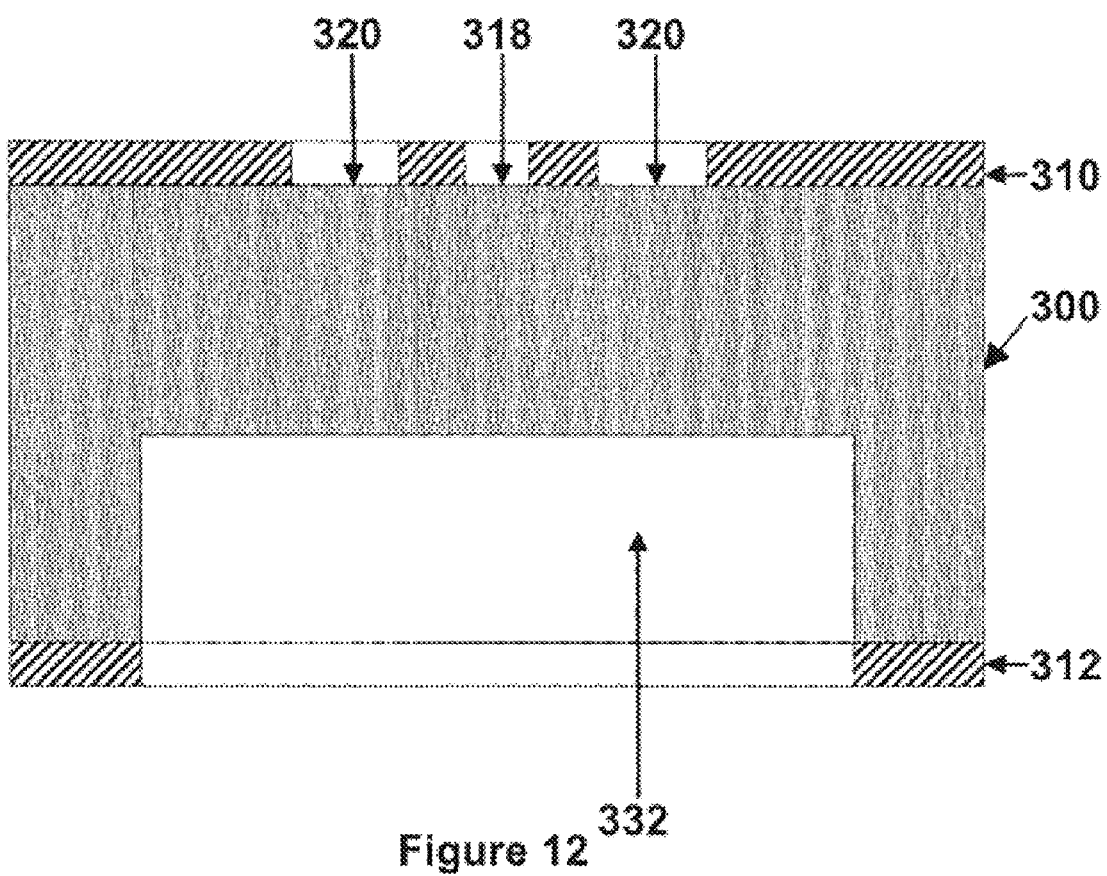
FIG. 12 is a cross-sectional view of the silicon substrate 300 showing removal of photoresist 326.

FIG. 11 is a cross-sectional view of the silicon substrate 300 showing removal of silicon substrate 300 from the region 332 in the pattern of 324. As shown in FIG. 11, a fluorine-based etch creates a cylindrical region that defines a reservoir 332. The reservoir 332 is etched until the desired depth is achieved and the remaining photoresist 326 is then removed in an oxygen plasma or in an actively oxidizing chemical bath like sulfuric acid ($H_2SO_4$) activated with hydrogen peroxide ($H_2O_2$), as shown in FIG. 12.

Figure 13:
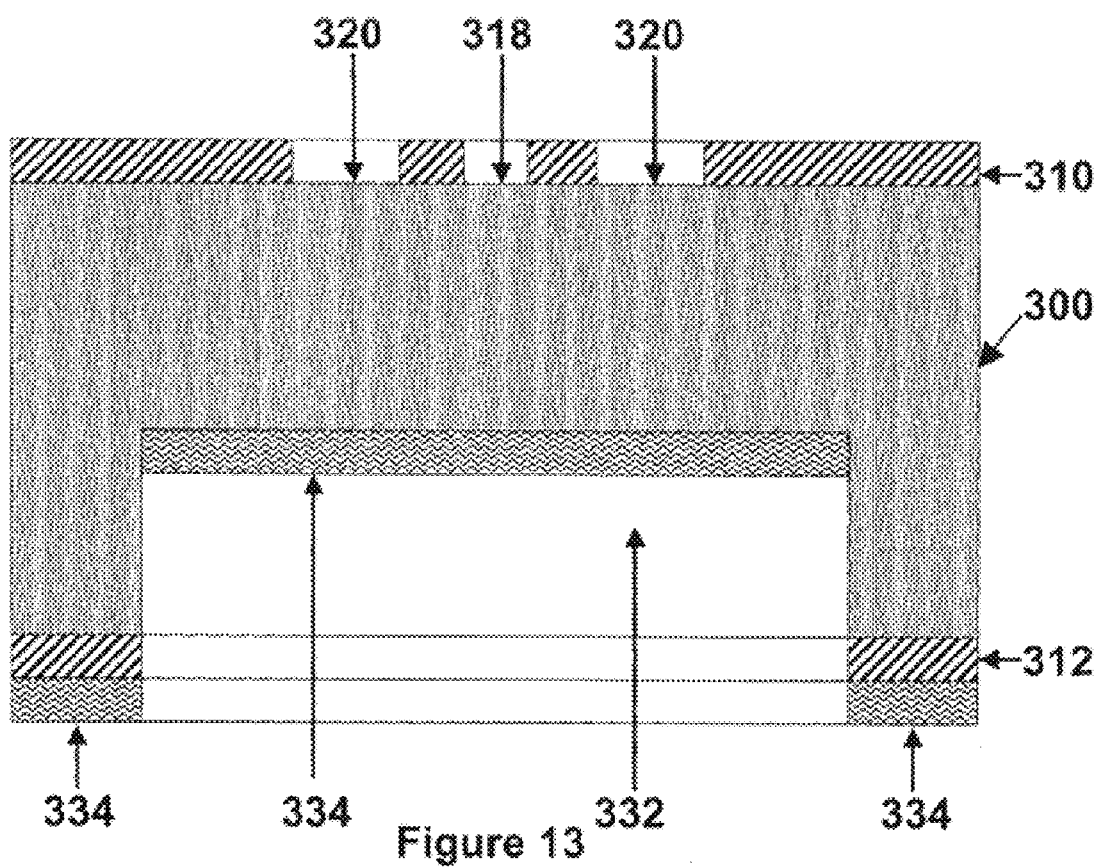
FIG. 13 is a cross-sectional view of the silicon substrate 300 showing deposition of etch stop material 334 on the reservior side of the device.

FIG. 13 is a cross-sectional view of the silicon substrate 300 showing deposition of etch stop material 334 on the reservior side of the device. Referring to FIG. 13, a plasma enhanced chemical vapor deposition ("PECVD") silicon dioxide layer 334 is deposited on the reservoir side of the substrate 300 to serve as an etch stop for the subsequent etch of the through substrate channel 336 shown in FIG. 17.

Figure 14:
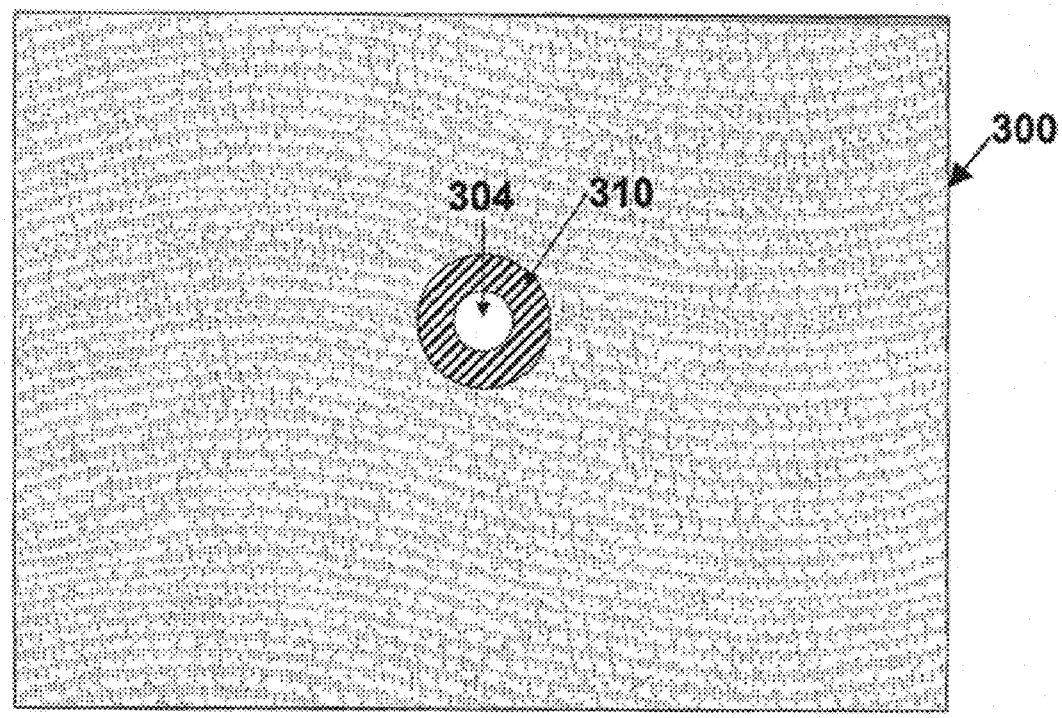
FIG. 14 is a plan view of a secondary channel mask of the device.
Figure 15:
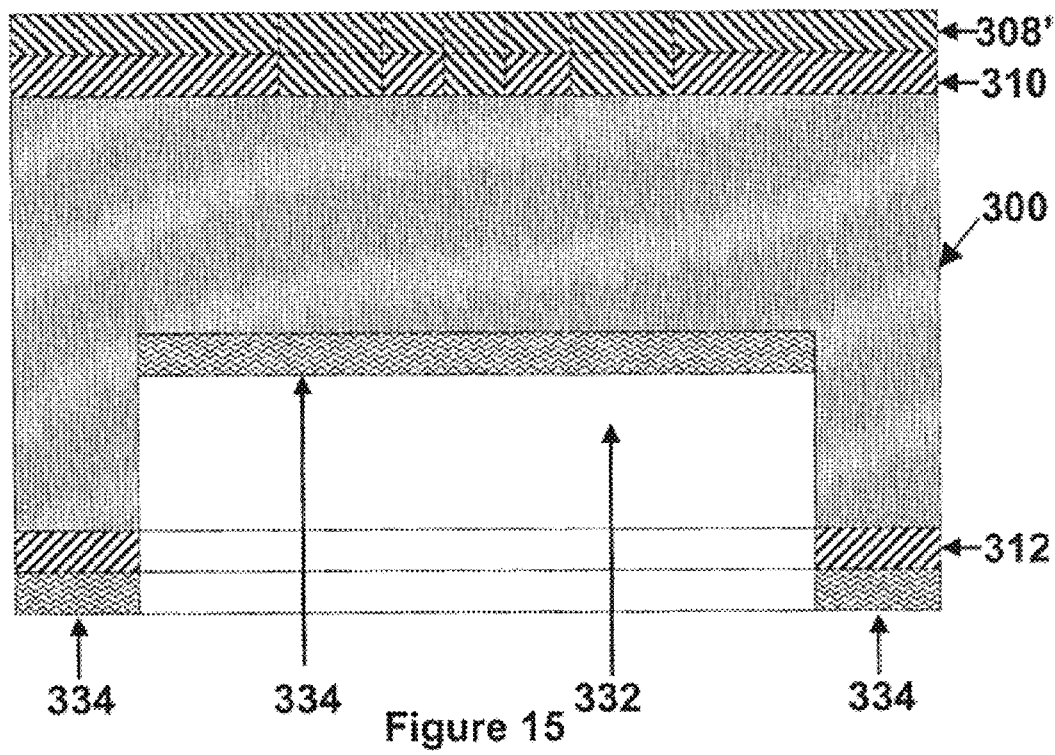
FIG. 15 is a cross-sectional view of the silicon substrate 300 of FIG. 8 with a new layer of photoresist 308'.
Figure 16:
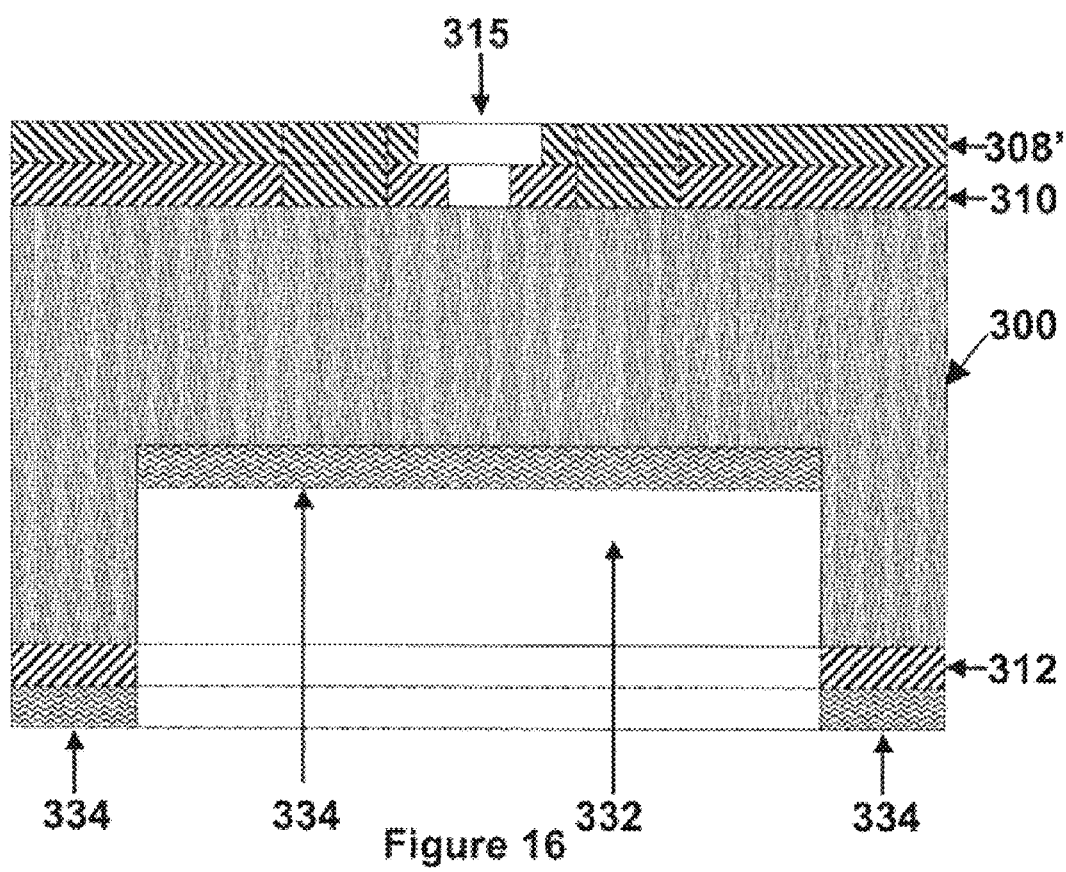
FIG. 16 is a cross-sectional view of the silicon substrate 300 showing removal of the secondary mask through hole region 315 of photoresist layer 308' exposing the nozzle hole 318 of FIG. 8.
Figure 17:
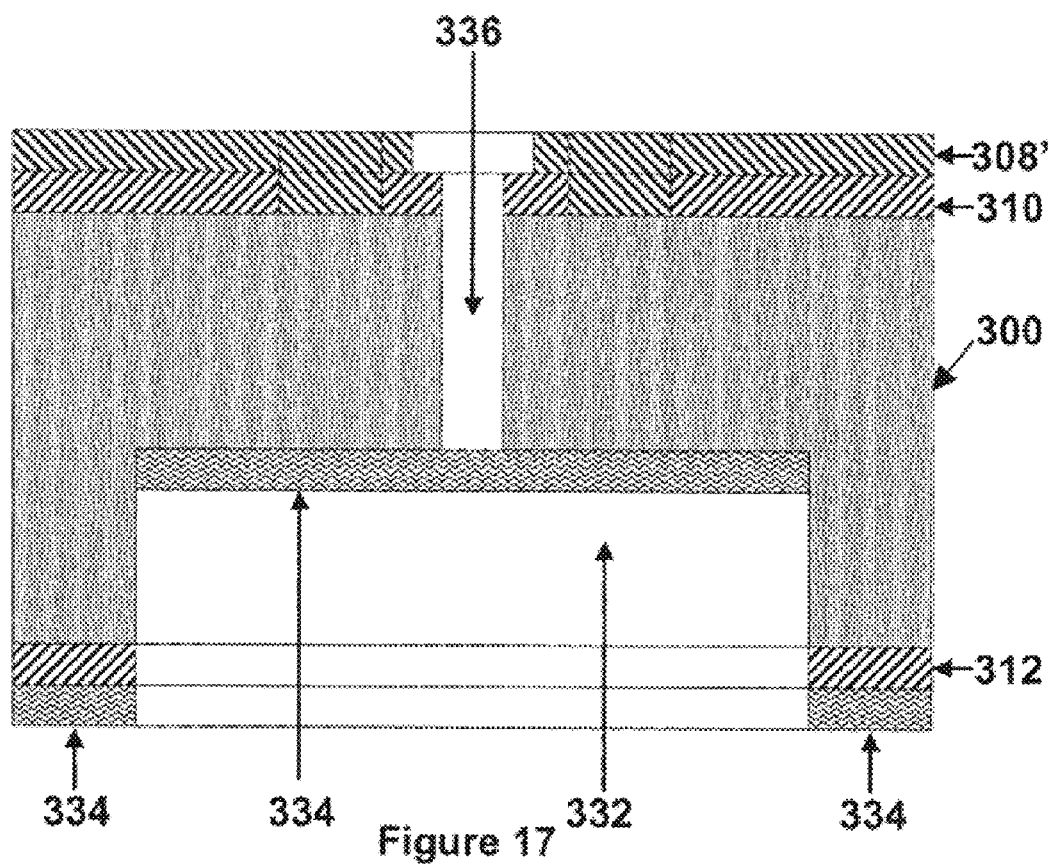
FIG. 17 is a cross-sectional view of the silicon substrate 300 showing removal of the silicon substrate material from the region 318 to the etch stop to form a cylinder 336.

A film of positive-working photoresist 308' is deposited on the silicon dioxide layer 310 on the nozzle side of the substrate 300, as shown in FIG. 15. Referring to FIG. 16, an area of the photoresist 315 corresponding to the entrance to through-wafer channels is selectively exposed through a mask (FIG. 14) by an optical lithographic exposure tool passing short-wavelength light, such as blue or near-ultraviolet at wavelengths of 365, 405, or 436 nanometers.

As shown in the cross-sectional view of FIG. 16, after development of the photoresist 308', the exposed area 304 of the photoresist is removed to the underlying silicon substrate 315. The remaining photoresist 308' and the exposed silicon dioxide primary mask 310 are used as a mask during the subsequent fluorine-based DRIE silicon etch to vertically etch the through-wafer channels 336 shown in FIG. 17. After etching the through-wafer channels 336, the remaining photoresist 308' is removed from the silicon substrate 300, as shown in the cross-sectional view of FIG. 18.

Figure 18:
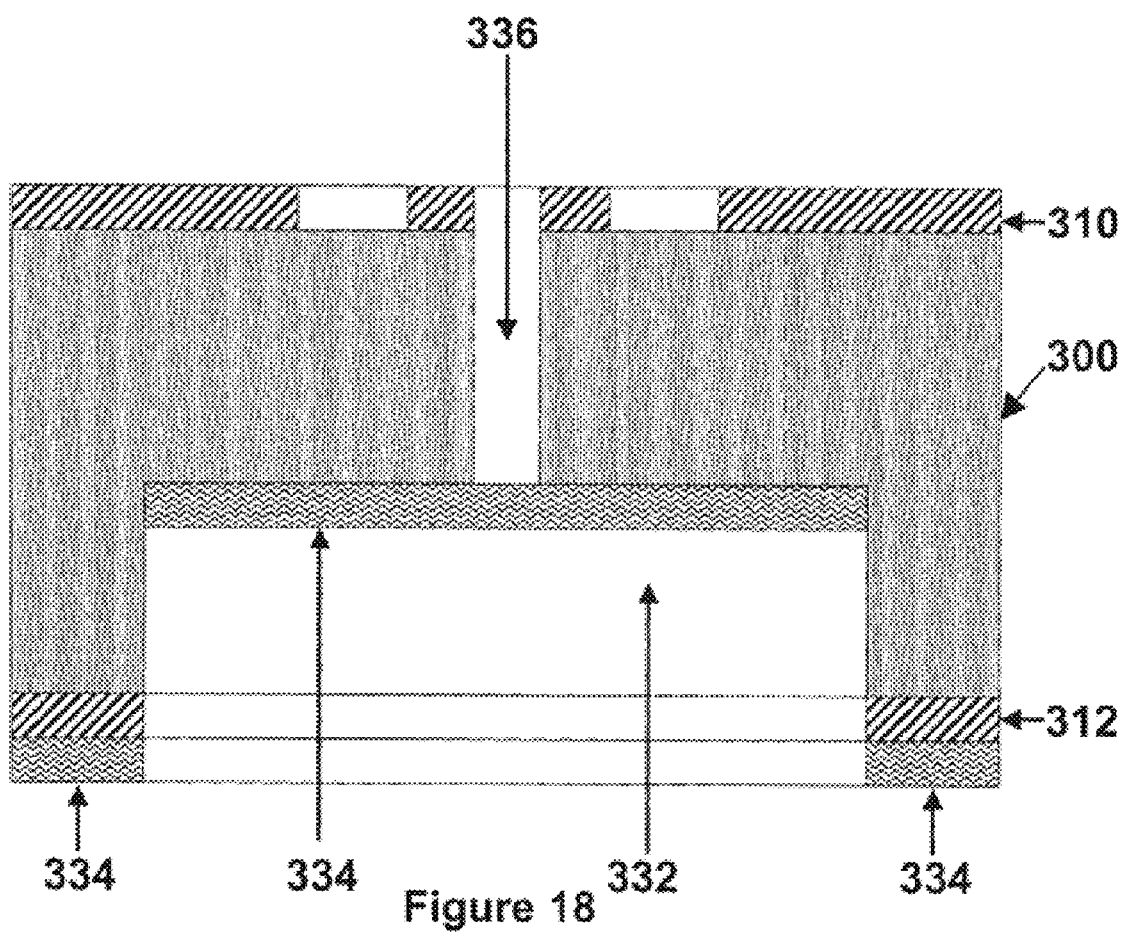
FIG. 18 is a cross-sectional view of the silicon substrate 300 showing removal of photoresist 308'.
Figure 19:
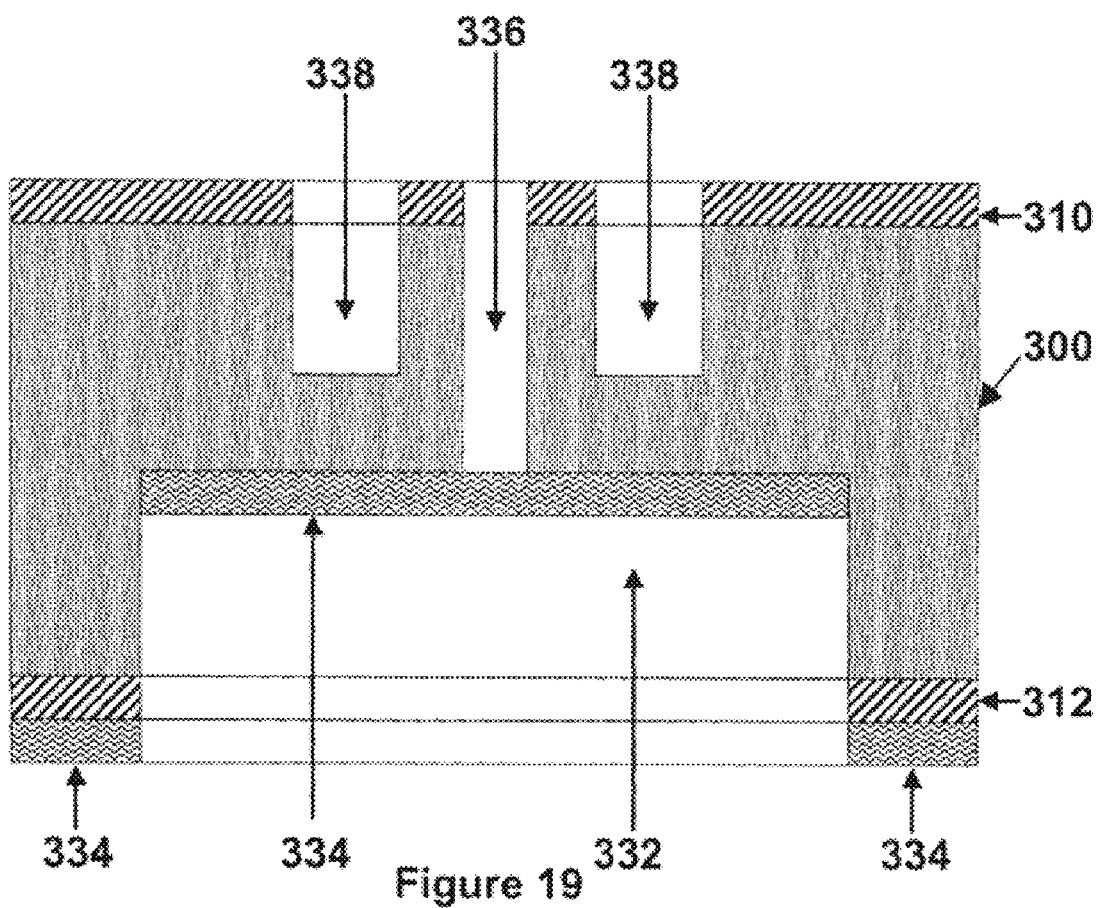
FIG. 19 is a cross-sectional view of the silicon substrate 300 showing removal of silicon substrate 300 in the region 338 to form an annular space around the cylinder 336.
Figure 20:
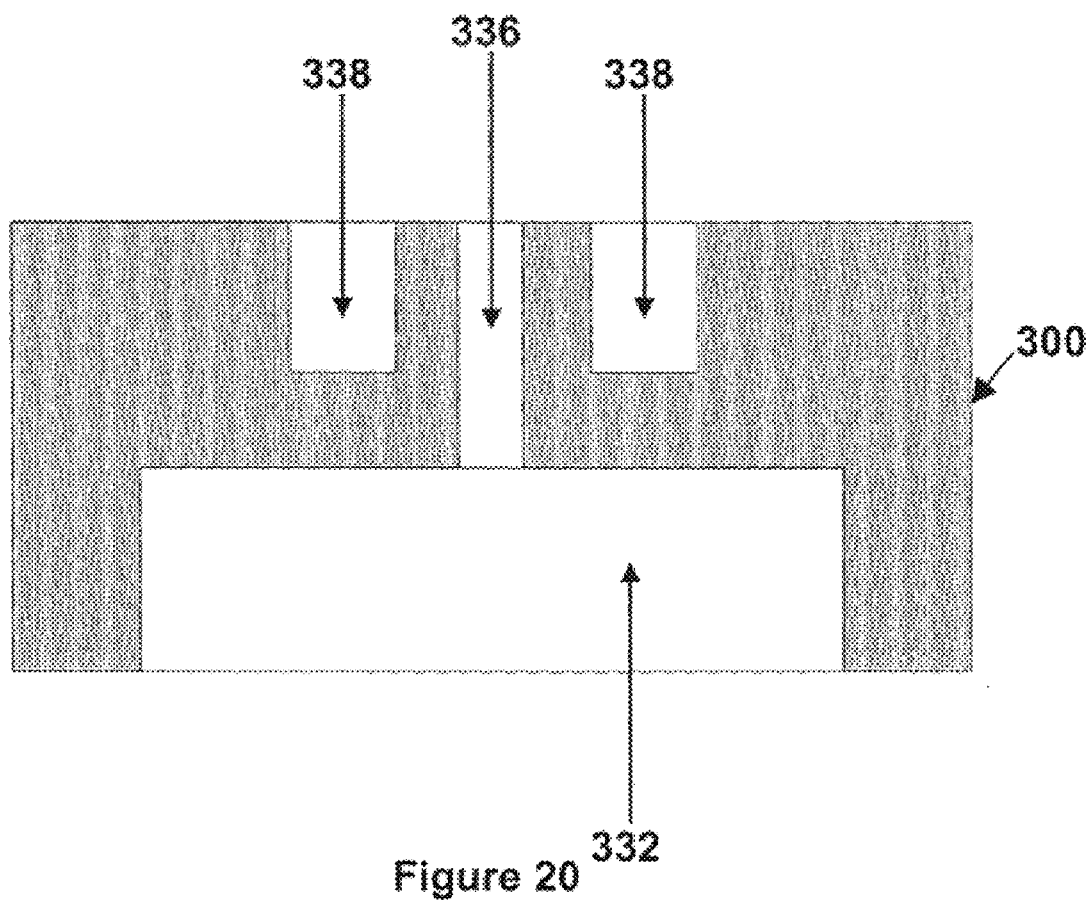
FIG. 20 is a cross-sectional view of the silicon substrate 300 showing removal of etch stop layer 334 and silicon dioxide layers 310 and 312.

The removal of the photoresist 308' exposes the mask pattern of FIG. 14 formed in the silicon dioxide 310 as shown in FIG. 18. The fluorine-based DRIE silicon etch is used to vertically etch the recessed annular region 338 shown in FIG. 19. Referring to FIG. 20, the silicon dioxide layers 310 and 312 and etch stop layer 334 are removed from the substrate by a hydrofluoric acid process.

An advantage of the fabrication process described herein is that the process simplifies the alignment of the through-wafer channels and the recessed annular region. This allows the fabrication of smaller nozzles with greater ease without any complex alignment of masks. Dimensions of the through channel, such as the aspect ratio (i.e. depth to width), can be reliably and reproducibly limited and controlled.

FIG. 14 is a plan view of a secondary channel mask of an electrospray device. The pattern in the secondary mask has a greater diameter and completely overlaps the exposed pattern of the underlying primary mask to improve alignment etching of the through channel.

Figure 21:
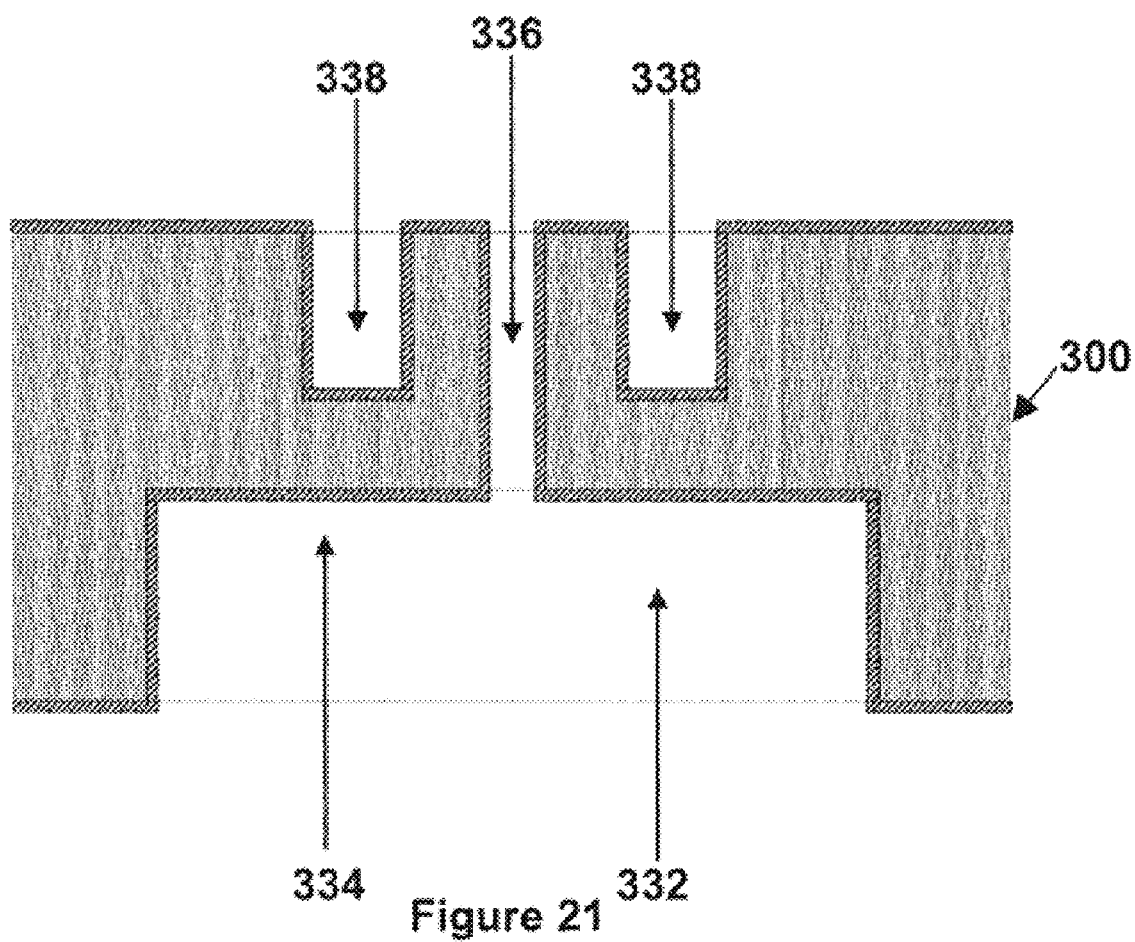
FIG. 21 is a cross-sectional view of the silicon substrate 300 showing thermal oxidation of the exposed silicon substrate 300 to form a layer of silicon dioxide on all exposed silicon surfaces.

FIG. 21 is a cross-sectional view of the silicon substrate 300 showing thermal oxidation of the exposed silicon substrate 300 to form a layer of silicon dioxide on all exposed silicon surfaces. An optional step includes growing a layer of thermal dry oxide and stripping with acid in order to clean the wafer.

Figure 22:
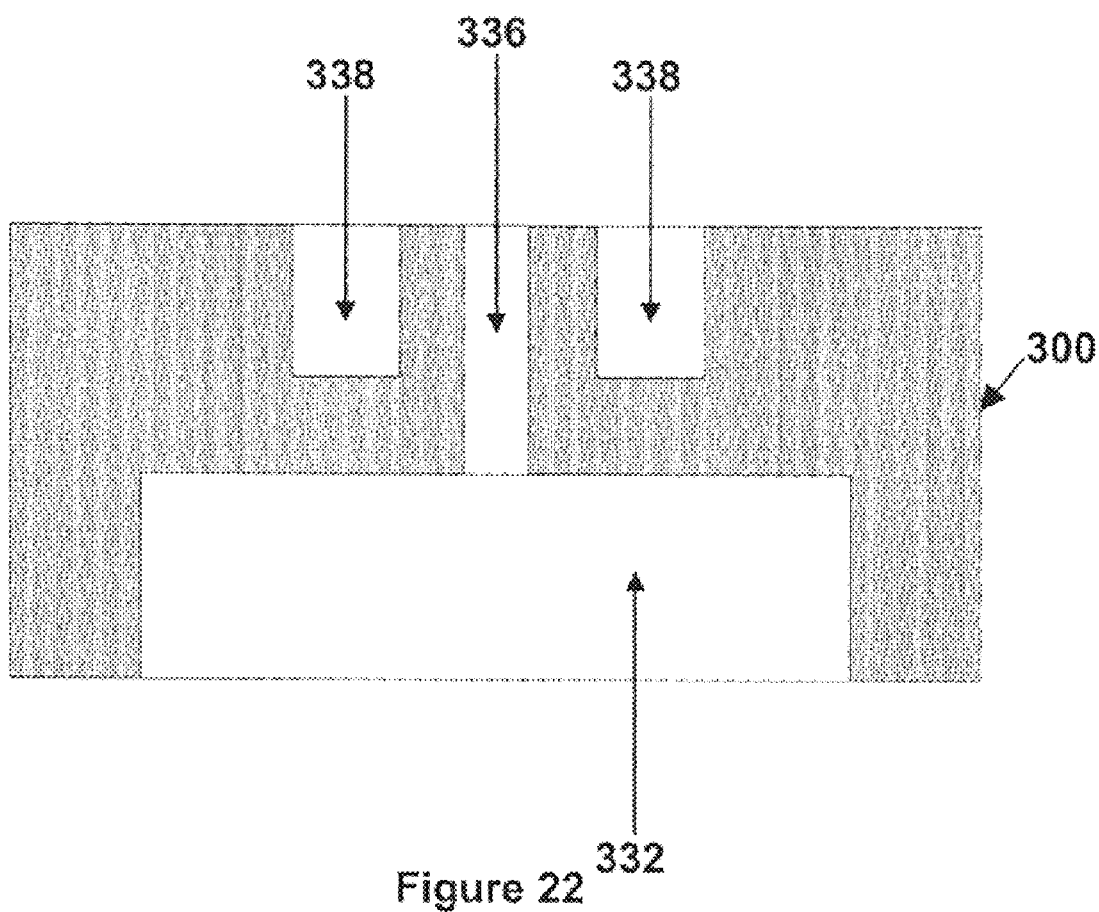
FIG. 22 is a cross-sectional view of the silicon substrate 300 showing removal of the grown oxide.

FIG. 22 is a cross-sectional view of the silicon substrate 300 showing removal of the grown oxide.

Figure 23:
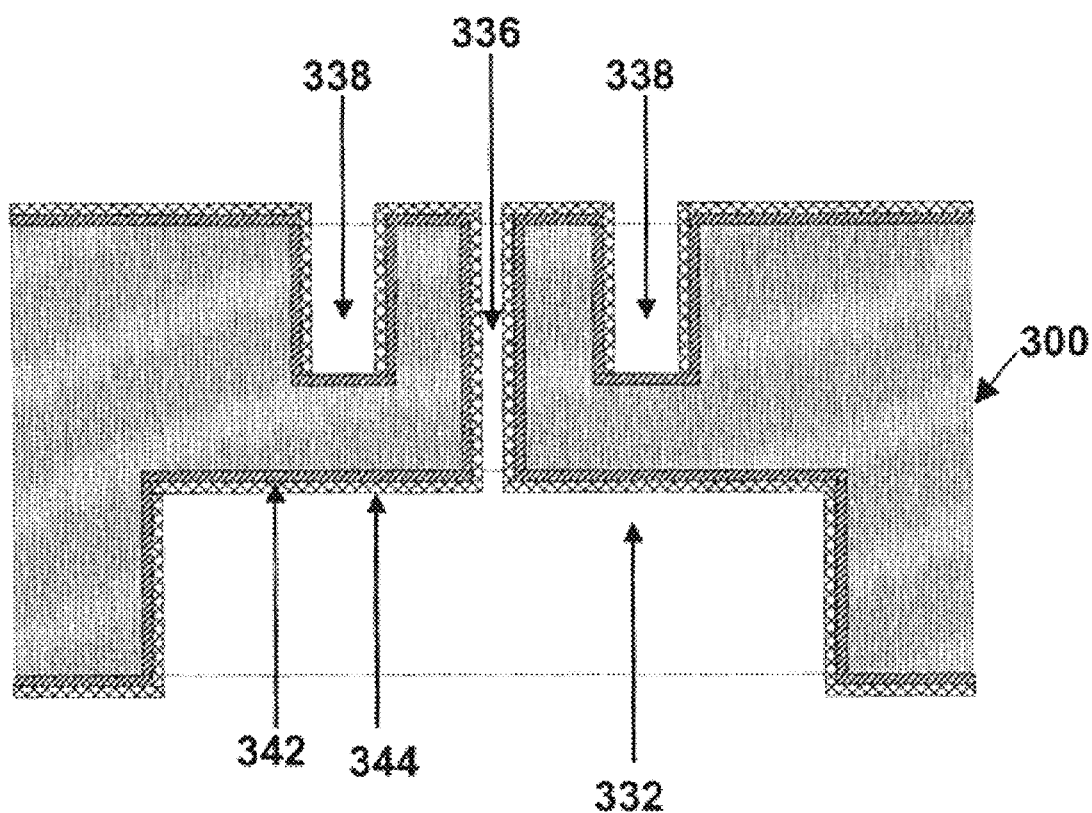
FIG. 23 is a cross-sectional view of the silicon substrate 300 showing the device coated with a dielectric thin film.

Referring to FIG. 23, the silicon wafer 300 is subjected to an elevated temperature in an oxidizing environment to grow a layer or film of silicon dioxide 342 on all silicon surfaces to a thickness of approximately 1–3 $\mu$m. The silicon dioxide layer serves as an electrical insulating layer. Silicon nitride 344 is further deposited using low pressure chemical vapor deposition (LPCFD) to provide a conformal coating of silicon nitride on all surfaces up to 2 $\mu$m in thickness. LPCVD silicon nitride also provides further electrical insulation and a fluid barrier that prevents fluids and ions contained therein that are introduced to the electrospray device from causing an electrical connection between the fluid and the silicon substrate 300. This allows for the independent application of a potential voltage to a fluid and the substrate with this electrospray device to generate the high electric field at the nozzle tip required for successful nanoelectrospray of fluids from microchip devices.

FIG. 23 is a cross-sectional view of the silicon substrate 300 showing the device coated with a multiple dielectric thin film layer.

Arrays of electrospray nozzles on a multi-system chip may be interfaced with a sampling orifice of a mass spectrometer by positioning the nozzles near the sampling orifice. The tight configuration of electrospray nozzles allows the positioning thereof in close proximity to the sampling orifice of a mass spectrometer.

A multi-system chip may be manipulated relative to the ion sampling orifice to position one or more of the nozzles for electrospray near the sampling orifice. Appropriate voltage(s) may then be applied to the one or more of the nozzles for electrospray.

The above described fabrication sequences for the electrospray device can be easily adapted to and are applicable for the simultaneous fabrication of a single monolithic system comprising multiple electrospray devices including multiple channels and/or multiple ejection nozzles embodied in a single monolithic substrate. Further, the processing steps may be modified to fabricate similar or different electrospray devices merely by, for example, modifying the layout design and/or by changing the polarity of the photomask and utilizing negative-working photoresist rather than utilizing positive-working photoresist.

The fabrication methods confer superior mechanical stability to the fabricated electrospray device by etching the features of the electrospray device from a monocrystalline silicon substrate without any need for assembly. The alignment scheme allows for nozzle walls of less than 2 $\mu$m and nozzle outer diameters down to 5 $\mu$m to be fabricated reproducibly. Further, the lateral extent and shape of the recessed annular region can be controlled independently of its depth. The depth of the recessed annular region also determines the nozzle height and is determined by the extent of etch on the nozzle side of the substrate.

After fabrication of multiple electrospray devices on a single silicon wafer, the wafer can be diced or cut into individual devices. This exposes a portion of the silicon substrate on which a layer of conductive metal is deposited.

All silicon surfaces are oxidized to form silicon dioxide with a thickness that is controllable through choice of temperature and time of oxidation. All silicon dioxide surfaces are LPCVD coated with silicon nitride. The final thickness of the silicon dioxide and silicon nitride can be selected to provide the desired degree of electrical isolation in the device. A thicker layer of silicon dioxide and silicon nitride provides a greater resistance to electrical breakdown. The silicon substrate is divided into the desired size or array of electrospray devices for purposes of metalization of the edge of the silicon substrate. The edge of the silicon substrate is coated with a conductive material using well known thermal evaporation and metal deposition techniques.

An advantage of the fabrication process described herein is that the process simplifies the alignment of the through-wafer channels and the recessed annular region. This allows the fabrication of smaller nozzles with greater ease without any complex alignment of masks. Dimensions of the through channel, such as the aspect ratio (i.e. depth to width), can be reliably and reproducibly limited and controlled.

Although the invention has been described in detail for the purpose of illustration, it is understood that such detail is solely for that purpose, and variations can be made therein by those skilled in the art without departing from the spirit and scope of the invention which is defined by the following claims.

What is claimed is:

1. A method for fabricating a nozzle on a substrate comprising:
   a) applying on a surface of the substrate a primary hard mask in a nozzle pattern including a through channel and annulus around the nozzle;
   b) patterning the primary mask;
   c) exposing the substrate under the channel portion of the primary mask;
   d) applying a secondary mask having a channel pattern larger than and completely overlying the exposed substrate under the channel portion of the primary mask; and
   e) removing the substrate under the channel portion of the primary mask to form a through channel in the substrate.

2. A method for fabricating a nozzle on a substrate comprising:
   a) applying a primary hard mask in a nozzle pattern on a surface of the substrate;
   b) applying a spin photoresist for patterning of the primary mask, including the through channel, annulus, and alignment marks for the through channel secondary mask pattern;
   c) etching the primary mask with dry plasma or wet chemical etch;
   d) stripping the photoresist;
   e) spinning photoresist on backside of substrate;
   f) patterning the backside feature;
   g) etching the backside mask;
   h) etching the feature into the substrate;
   i) stripping the backside photoresist;
   j) depositing etch stop material on backside;
   k) spinning photoresist on substrate front side;
   l) patterning front side photoresist with the through channel feature;
   m) etching through channel into substrate until etch stop is reached;
   n) stripping the front side photoresist;
   o) etching the annulus into the substrate;
   p) cleaning the wafer chemical and remove thin films;
   q) growing thermal dry oxide and strip the grown oxide with acid in order to clean the wafers; and
   r) coating device with dielectric thin film.

* * * * *